United States Patent
Lo et al.

(10) Patent No.: US 8,803,648 B2
(45) Date of Patent: Aug. 12, 2014

(54) THREE-DIMENSIONAL MULTILAYER SOLENOID TRANSFORMER

(75) Inventors: Chi Shun Lo, San Diego, CA (US);
Jonghae Kim, San Diego, CA (US);
Chengjie Zuo, Santee, CA (US);
Changhan Hobie Yun, San Diego, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 77 days.

(21) Appl. No.: 13/463,257

(22) Filed: May 3, 2012

(65) Prior Publication Data

US 2013/0293336 A1    Nov. 7, 2013

(51) Int. Cl.
*H01F 5/00* (2006.01)
*H01F 27/28* (2006.01)
*H01F 27/29* (2006.01)

(52) U.S. Cl.
USPC ........... 336/200; 336/232; 336/228; 336/225; 336/223; 336/192; 336/182

(58) Field of Classification Search
CPC ............ H01F 17/0013; H01F 17/0033; H01F 27/2804; H01F 5/003; H01F 41/046
USPC .......... 336/200, 232, 228, 223, 225, 192, 182
See application file for complete search history.

(56) References Cited

U.S. PATENT DOCUMENTS

| | | | |
|---|---|---|---|
| 5,095,357 A | | 3/1992 | Andoh et al. |
| 6,031,445 A * | | 2/2000 | Marty et al. ................... 336/200 |
| 6,531,945 B1 * | | 3/2003 | Ahn et al. ..................... 336/200 |
| 6,586,309 B1 * | | 7/2003 | Yeo et al. ...................... 438/381 |
| 6,885,275 B1 | | 4/2005 | Chang |
| 7,170,384 B2 * | | 1/2007 | Kim et al. ..................... 336/200 |
| 7,452,796 B2 | | 11/2008 | Davies |
| 7,518,248 B2 | | 4/2009 | Li et al. |
| 7,868,729 B2 * | | 1/2011 | Wang et al. ................... 336/223 |
| 8,339,233 B2 * | | 12/2012 | Tsai et al. ..................... 336/200 |

(Continued)

FOREIGN PATENT DOCUMENTS

| | | |
|---|---|---|
| EP | 0778593 A1 | 6/1997 |
| EP | 0856855 A2 | 8/1998 |

OTHER PUBLICATIONS

International Search Report and Written Opinion—PCT/US2013/037173—ISA/EPO—Jul. 11, 2013.

*Primary Examiner* — Alexander Talpalatski
*Assistant Examiner* — Kazi Hossain
(74) *Attorney, Agent, or Firm* — Weaver Austin Villeneuve & Sampson, LLP

(57) ABSTRACT

This disclosure provides implementations of inductors, transformers, and related processes. In one aspect, a device includes a substrate having first and second surfaces. A first inducting arrangement includes a first set of vias, a second set of vias, a first set of traces arranged over the first surface connecting the first and second vias, and a second set of traces arranged over the second surface connecting the first and second vias. A second inducting arrangement is inductively-coupled and interleaved with the first inducting arrangement and includes a third set of vias, a fourth set of vias, a third set of traces arranged over the first surface connecting the third and fourth vias, and a fourth set of traces arranged over the second surface connecting the third and fourth vias. One or more sets of dielectric layers insulate portions of the traces from one another.

9 Claims, 14 Drawing Sheets

(56) References Cited

U.S. PATENT DOCUMENTS

| | | |
|---|---|---|
| 2002/0002771 A1 | 1/2002 | Lin et al. |
| 2004/0124961 A1* | 7/2004 | Aoyagi .................. 336/200 |
| 2008/0001698 A1* | 1/2008 | Hazucha et al. .......... 336/200 |
| 2008/0303623 A1* | 12/2008 | Hsu et al. .................. 336/200 |
| 2011/0084765 A1 | 4/2011 | Kim et al. |

* cited by examiner

THREE-DIMENSIONAL MULTILAYER SOLENOID TRANSFORMER

TECHNICAL FIELD

The described technology relates generally to inductors and transformers, and more specifically to a three-dimensional solenoid transformer that includes a multilayer interleaving scheme.

DESCRIPTION OF THE RELATED TECHNOLOGY

Electromechanical systems (EMS) include devices having electrical and mechanical elements, transducers such as actuators and sensors, optical components (including mirrors), and electronics. EMS can be manufactured at a variety of scales including, but not limited to, microscales and nanoscales. For example, microelectromechanical systems (MEMS) devices can include structures having sizes ranging from about one micron to hundreds of microns or more. Nanoelectromechanical systems (NEMS) devices can include structures having sizes smaller than one micron including, for example, sizes smaller than several hundred nanometers. Electromechanical elements may be created using deposition, etching, lithography, or other micromachining processes that etch away parts of substrates or deposited material layers, or that add layers to form electrical, mechanical, and electromechanical devices.

One type of EMS device is called an interferometric modulator (IMOD). As used herein, the term IMOD or interferometric light modulator refers to a device that selectively absorbs or reflects light using the principles of optical interference. In some implementations, an IMOD may include a pair of conductive plates, one or both of which may be transparent or reflective, wholly or in part, and capable of relative motion upon application of an appropriate electrical signal. In an implementation, one plate may include a stationary layer deposited on a substrate and the other plate may include a reflective membrane separated from the stationary layer by an air gap. The position of one plate in relation to another can change the optical interference of light incident on the IMOD. IMOD devices have a wide range of applications, and are anticipated to be used in improving existing products and creating new products, especially those with display capabilities.

Various electronic circuit components can be implemented at the EMS level, including inductors and transformers. Such circuit components may be suitable for use in various types of electronic devices, such as integrated circuits (ICs), integrated passive devices, printed circuit boards (PCBs), or low temperature co-fired ceramic (LTCC) devices. A transformer can transfer electrical energy from one circuit to another through inductively-coupled coils or windings. For example, in a traditional design, a varying current, Ip, in a primary coil induces a voltage, Vs, in a secondary coil. When a load is connected to the secondary coil, electrical energy can be transferred through the coils to the load. The induced voltage, Vs, in the second coil is generally proportional to a voltage, Vp, delivered to the first coil and is given by the ratio of the number of turns (windings) in the second coil, Ns, to the number of turns in the first coil, Np. This transformation ratio is generally defined as follows:

$$Vs/Vp = Ns/Np$$

In some modern circuits, small form factor transformers are specified. Conventional transformers made of relatively large metal spiral inductors often do not meet such specifications, especially as devices become increasingly smaller and power requirements become increasingly important. Transformers suitable for use in some IC devices may be implemented using high-resistivity substrates, such as glass substrates. Generally, transformers incorporating such substrates can be implemented as planar transformers or as solenoid transformers. Traditional solenoid transformers generally have higher quality (Q) factors than planar transformers, but traditional solenoid transformers may have coupling coefficients (k) not suitable for use in modern circuits. While planar transformers generally have higher k values than solenoid transformers, planar transformers may have Q factors not suitable for use in modern circuits. Additionally, a fundamental bottleneck exists when attempting to increase the k value—the pitch of the through-glass-via (TGV).

SUMMARY

The structures, devices, apparatus, systems, and processes of the disclosure each have several innovative aspects, no single one of which is solely responsible for the desirable attributes disclosed herein.

Disclosed are example implementations of inductors, transformers, devices, apparatus, systems, and related fabrication processes.

According to one innovative aspect of the subject matter described in this disclosure, a device includes a substrate having a first surface and a second surface. The device includes a first inducting arrangement including a plurality of first conductive pathways that together form a first conductive path. The first conductive path has a first axis of revolution. In some implementations, the plurality of first conductive pathways includes a first set of vias extending at least from the first surface to the second surface, a second set of vias extending at least from the first surface to the second surface, a first set of traces arranged over the first surface that connect the first set of vias with the second set of vias, and a second set of traces arranged over the second surface that connect the first set of vias with the second set of vias. The device also includes a second inducting arrangement inductively-coupled with and interleaved with the first inducting arrangement and including a plurality of second conductive pathways that together form a second conductive path. The second conductive path has a second axis of revolution, at least part of the first axis of revolution being inside the second inducting arrangement, the second axis of revolution being inside the first inducting arrangement. In some implementations, the plurality of second conductive pathways includes a third set of vias extending at least from the first surface to the second surface, a fourth set of vias extending at least from the first surface to the second surface, a third set of traces arranged over the first surface that connect the third set of vias with the fourth set of vias, and a fourth set of traces arranged over the second surface that connect the third set of vias with the fourth set of vias. The device also includes a first set of one or more dielectric layers that insulate portions of the first traces from portions of the third traces, and a second set of one or more dielectric layers that insulate portions of the second traces from portions of the fourth traces.

In some implementations, the first set of vias are arranged along a first row and the second set of vias are arranged along a second row, each of the first set of traces connecting a via from the first row with a via from the second row over the first surface, each of the second set of traces connecting a via from the first row with a via from the second row over the second surface. In some implementations, the third set of vias are arranged along a third row and the fourth set of vias are arranged along a fourth row, each of the third set of traces connecting a via from the third row with a via from the fourth row over the third surface, each of the fourth set of traces connecting a via from the third row with a via from the fourth row over the second surface.

In some implementations, the first set of traces are formed from a first conductive layer deposited and patterned on the first surface and the first set of one or more dielectric layers that insulate portions of the first set of traces from portions of the third set of traces include a first dielectric layer deposited and patterned over the first surface so as to cover portions of the first set of traces. In some implementations, the third set of traces are formed from a third conductive layer deposited and patterned over the first dielectric layer. In some implementations, the second set of traces are formed from a second conductive layer deposited and patterned on the second surface and the second set of one or more dielectric layers that insulate portions of the second set of traces from portions of the fourth set of traces include a second dielectric layer deposited and patterned over the second surface so as to cover portions of the second set of traces. In some implementations, the fourth set of traces are formed from a fourth conductive layer deposited and patterned over the second dielectric layer.

In some implementations, the first set of traces are formed from a first conductive layer deposited and patterned on the first surface and the one or more dielectric layers that insulate portions of the first traces from portions of the third traces include a first dielectric layer deposited and patterned over the first surface so as to cover portions of the first set of traces. In some implementations, the third set of traces are formed from a third conductive layer deposited and patterned over the first dielectric layer. In some implementations, the fourth set of traces are formed from a fourth conductive layer deposited and patterned on the second surface and the one or more dielectric layers that insulate portions of the second traces from portions of the fourth traces include a second dielectric layer deposited and patterned over the second surface so as to cover portions of the fourth set of traces. In some implementations, the second set of traces are formed from a second conductive layer deposited and patterned over the second dielectric layer.

In some implementations, the plurality of first conductive pathways are arranged entirely within a region that is within the plurality of second conductive pathways. In some implementations, the first axis of revolution is laterally offset from the second axis of revolution. In some implementations, an effective number of turns of the first conductive pathways and an effective number of turns of the second conductive pathways are substantially equal as a result of the lateral offset such that the first inducting arrangement is inductively-coupled with the second inducting arrangement with a transformation ratio of substantially 1:1.

According to another innovative aspect of the subject matter described in this disclosure, a method includes providing a substrate; forming a plurality of vias in the substrate that each extend through the substrate from a first surface of the substrate to a second surface of the substrate, the plurality of vias including a first set of vias, a second set of vias, a third set of vias, and a fourth set of vias; depositing a first conductive layer over the first surface of the substrate to form a first set of traces that each connect a via from the first set of vias with a via from the second set of vias; depositing one or more first dielectric layers over portions of the first traces; depositing a third conductive layer over the first dielectric layers to form a third set of traces that each connect a via from the third set of vias with a via from the fourth set of vias; depositing a fourth conductive layer over the second surface of the substrate to form a fourth set of traces that each connect a via from the third set of vias with a via from the fourth set of vias; depositing one or more second dielectric layers over portions of the fourth traces; and depositing a second conductive layer over the second dielectric layers to form a second set of traces that each connect a via from the first set of vias with a via from the second set of vias.

In some implementations, the first set of vias, the second set of vias, the first set of traces, and the second set of traces form at least a portion of a first inducting arrangement including a plurality of first conductive pathways that together form a first conductive path, the first conductive path having a first axis of revolution. In some implementations, the third set of vias, the fourth set of vias, the third set of traces, and the fourth set of traces form at least a portion of a second inducting arrangement including a plurality of second conductive pathways that together form a second conductive path, the second conductive path having a second axis of revolution. In some implementations, the second inducting arrangement is inductively-coupled with and interleaved with the first inducting arrangement. In some implementations, the first axis of revolution is inside the second inducting arrangement and the second axis of revolution is inside the first inducting arrangement. In some implementations, the first axis of revolution is laterally offset from the second axis of revolution. In some implementations, an effective number of turns of the first conductive pathways and an effective number of turns of the second conductive pathways are substantially equal as a result of the lateral offset such that the first inducting arrangement is inductively-coupled with the second inducting arrangement with a transformation ratio of substantially 1:1.

According to another innovative aspect of the subject matter described in this disclosure, a device includes a substrate having a first surface and a second surface. The device includes a first inducting means including a plurality of first conductive pathways that together form a first conductive path, the first conductive path having a first axis of revolution. The plurality of first conductive pathways includes a first set of via means extending at least from the first surface to the second surface, a second set of via means extending at least from the first surface to the second surface, a first set of conductive means arranged over the first surface that connect the first set of via means with the second set of via means, and a second set of conductive means arranged over the second surface that connect the first set of via means with the second set of via means. The device also includes a second inducting means inductively-coupled with and interleaved with the first inducting means and including a plurality of second conductive pathways that together form a second conductive path, the second conductive path having a second axis of revolution. In some implementations, at least part of the first axis of revolution is inside the second inducting means, and the second axis of revolution is inside the first inducting means. The plurality of second conductive pathways includes a third set of via means extending at least from the first surface to the second surface, a fourth set of via means extending at least from the first surface to the second surface, a third set of conductive means arranged over the first surface that connect the third set of via means with the fourth set of via means, and a fourth set of conductive means arranged over the second surface that connect the third set of via means with the fourth set of via means. The device also includes a first set of one or more dielectric means that insulate portions of the first conductive means from portions of the third conductive means, and a second set of one or more dielectric means that insulate portions of the second conductive means from portions of the fourth conductive means.

BRIEF DESCRIPTION OF THE DRAWINGS

Like reference numbers and designations in the various drawings indicate like elements.

DETAILED DESCRIPTION

The following detailed description is directed to certain implementations for the purposes of describing the innovative aspects. However, the teachings herein can be applied and implemented in a multitude of different ways.

The disclosed implementations include examples of inducting arrangements (hereinafter simply "inductors") and transforming arrangements (hereinafter simply "transformers") that achieve both high Q factors and high k values. Related apparatus, systems, and fabrication processes and techniques are also disclosed.

Figure 1:
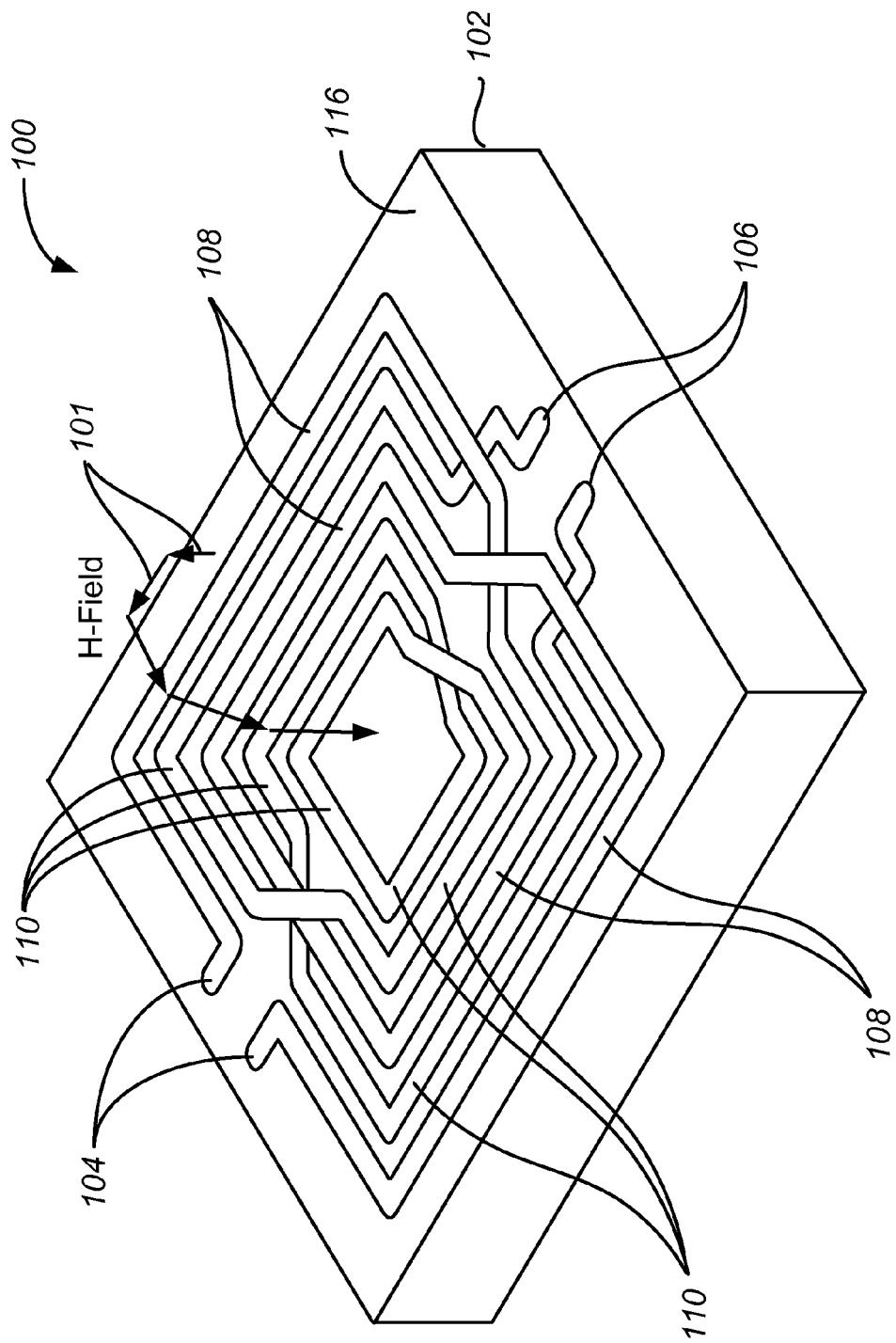
FIG. 1 shows an axonometric view of a planar transformer design in which the windings of the first inductor are interleaved with the windings of the second inductor on a surface of a substrate.

Transformers with high Q factors and high k are desirable for many applications, such as those involving impedance matching, and for many devices, such as baluns, filters, and duplexers. Some planar and solenoid transformer designs achieve higher k by interleaving the conductive windings of a first inductor of the transformer with the conductive windings of a second inductor of the transformer. FIG. 1 shows an axonometric view of a planar transformer design 100 in which the windings of the first inductor 104 are interleaved with the windings of the second inductor 106 on a surface of a substrate 102. The windings of the first inductor 104 are formed with first conductive traces 108. The windings of the second inductor 106 are formed with second conductive traces 110. Both the first traces 108 and the second traces 110 are patterned or arranged over a single upper surface 116 of the underlying substrate 102. Arrows 101 indicate magnetic (H) field lines; that is, a direction of the H field by and through the inductors 104 and 106.

Figure 2:
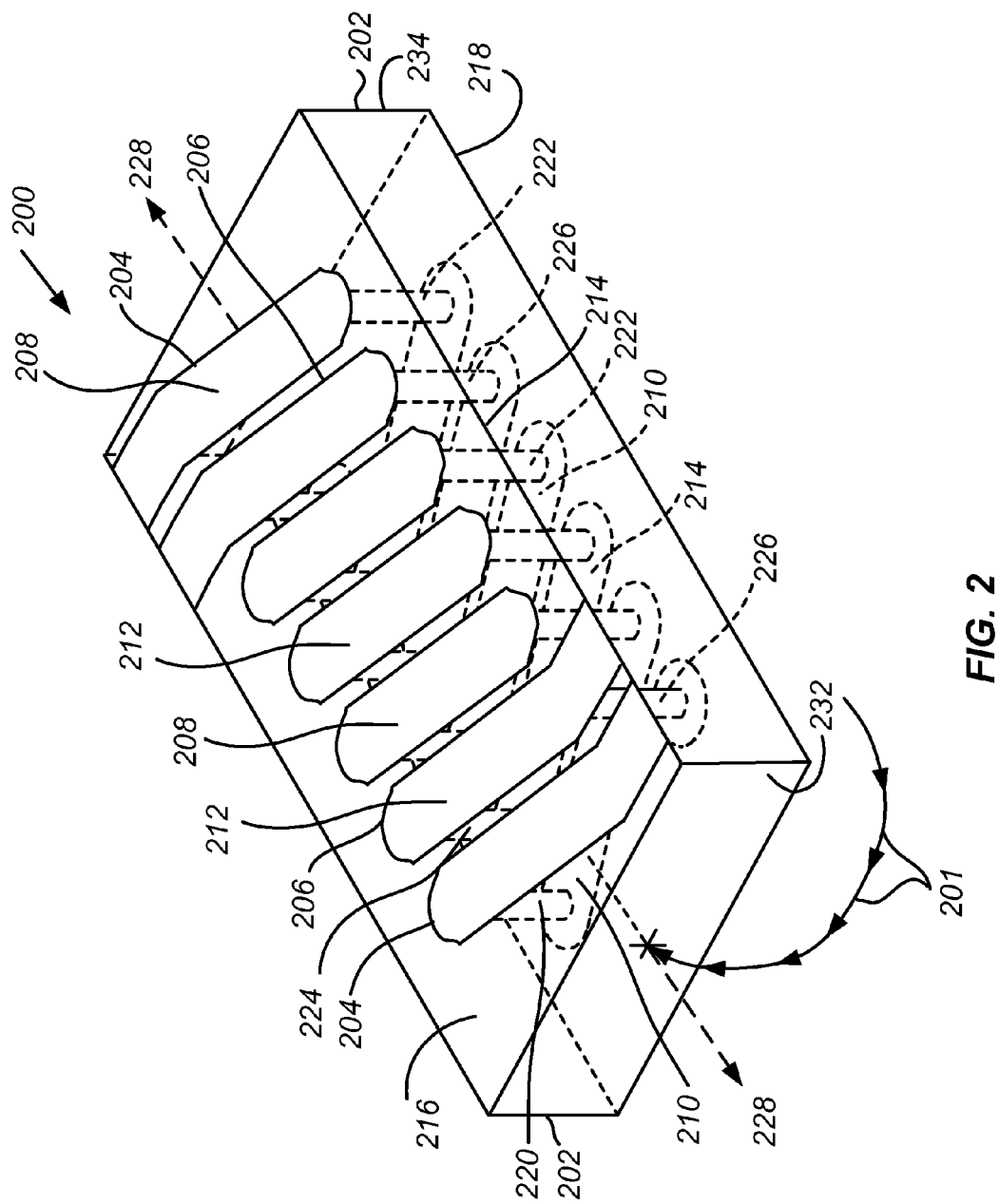
FIG. 2 shows an axonometric view, including hidden lines, of a solenoid transformer design in which the windings of the first inductor are interleaved with the windings of the second inductor within and on a substrate.

FIG. 2 shows an axonometric view, including hidden lines, of a solenoid transformer design 200 in which the windings of the first inductor 204 are interleaved with the windings of the second inductor 206 within and on a substrate 202. The substrate 202 has a first surface 216 and a second surface 218 opposite the first surface 216. The first inductor 204 includes a plurality of first conductive pathways or windings that together form a first conductive path. The plurality of first conductive pathways includes a first set of vias 220 extending from the first surface 216 to the second surface 218 and a second set of vias 222 extending from the first surface 216 to the second surface 218. The plurality of first conductive pathways includes a first set of traces 208 arranged over the first surface 216 that connect the first set of vias 220 with the second set of vias 222. The plurality of first conductive pathways further includes second set of traces 210 arranged over the second surface 218 that connect the first set of vias 220 with the second set of vias 222.

Similarly the second inductor 206 includes a plurality of second conductive pathways or windings that together form a second conductive path. The plurality of second conductive pathways includes a third set of vias 224 extending from the first surface 216 to the second surface 218 and a fourth set of vias 226 extending from the first surface 216 to the second surface 218. The plurality of second conductive pathways includes a third set of traces 212 arranged over the first surface 216 that connect the third set of vias 224 with the fourth set of vias 226. The plurality of second conductive pathways further includes a fourth set of traces 214 arranged over the second surface 218 that connect the third set of vias 224 with the fourth set of vias 226.

As shown, the first conductive pathways or windings are interleaved with the second conductive pathways or windings. More specifically, the first set of vias 220 and the third set of vias 224 are arranged in a first row while the second set of vias 222 and the fourth set of vias 226 are arranged in a second row parallel to the first row. The first, second, third, and fourth sets of vias 220, 222, 224, and 226, respectively, are positioned to enable the first set of traces 208 to be two-dimensionally interleaved with the third set of traces 212 such that the first set of traces 208 and the third set of traces 212 are arranged in alternating fashion along the first surface 216. Similarly, the first, second, third, and fourth sets of vias 220, 222, 224, and 226, respectively, are positioned to enable the second set of traces 210 to be two-dimensionally interleaved with the fourth set of traces 214 such that the second set of traces 210 and the fourth set of traces 214 are arranged in alternating fashion along the second surface 218. In such a design, the first conductive pathways and the second conductive pathways share an axis of revolution 228 that passes through first and second side surfaces 232 and 234. Arrows 201 indicate an H field line; that is, a direction of the H field by and through the inductors 204 and 206.

Figure 3:
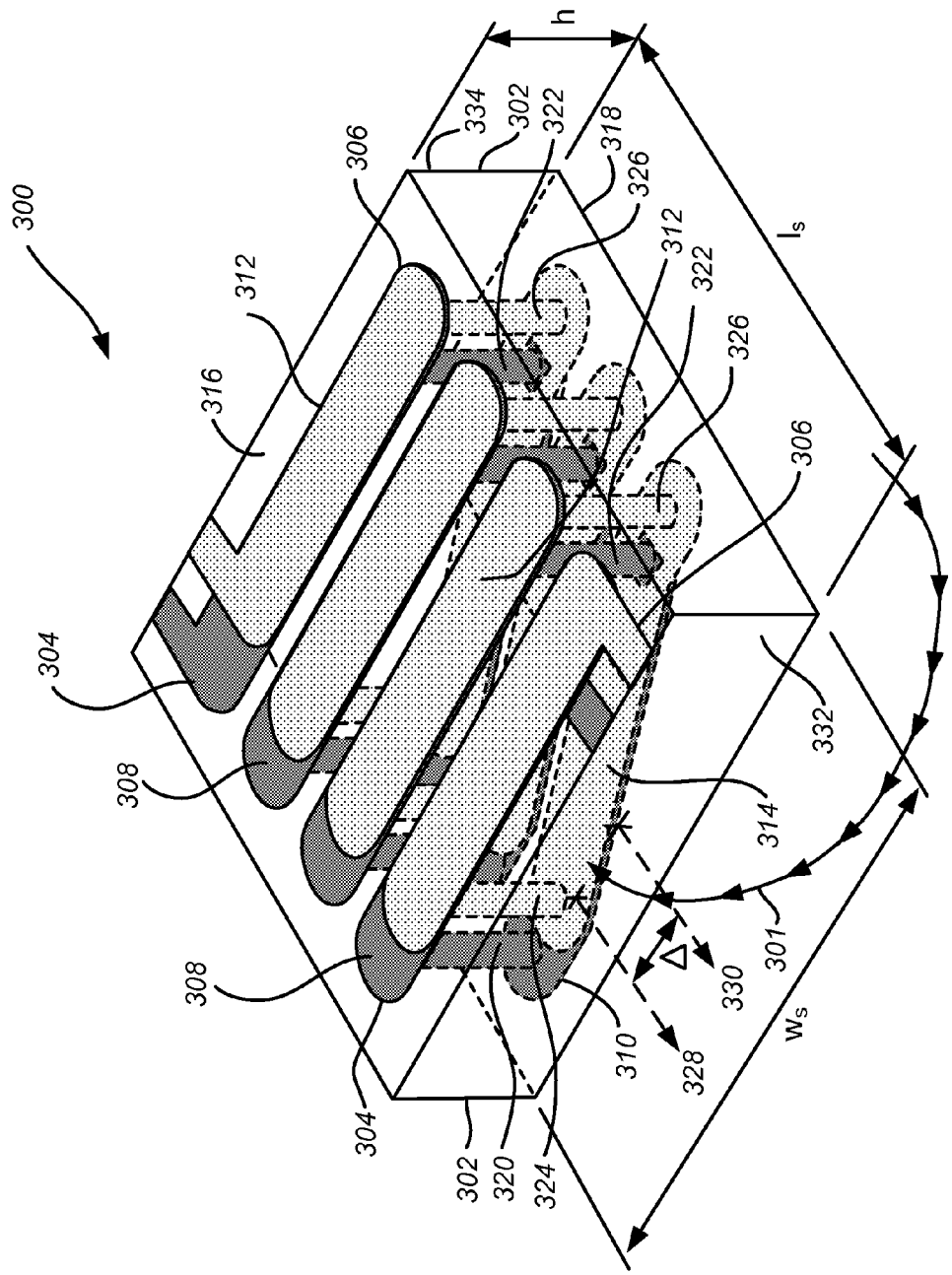
FIG. 3 shows an axonometric view, including hidden lines, of an example solenoid transformer design in which the windings of the first inductor are three-dimensionally interleaved with the windings of the second inductor.
Figure 4A:
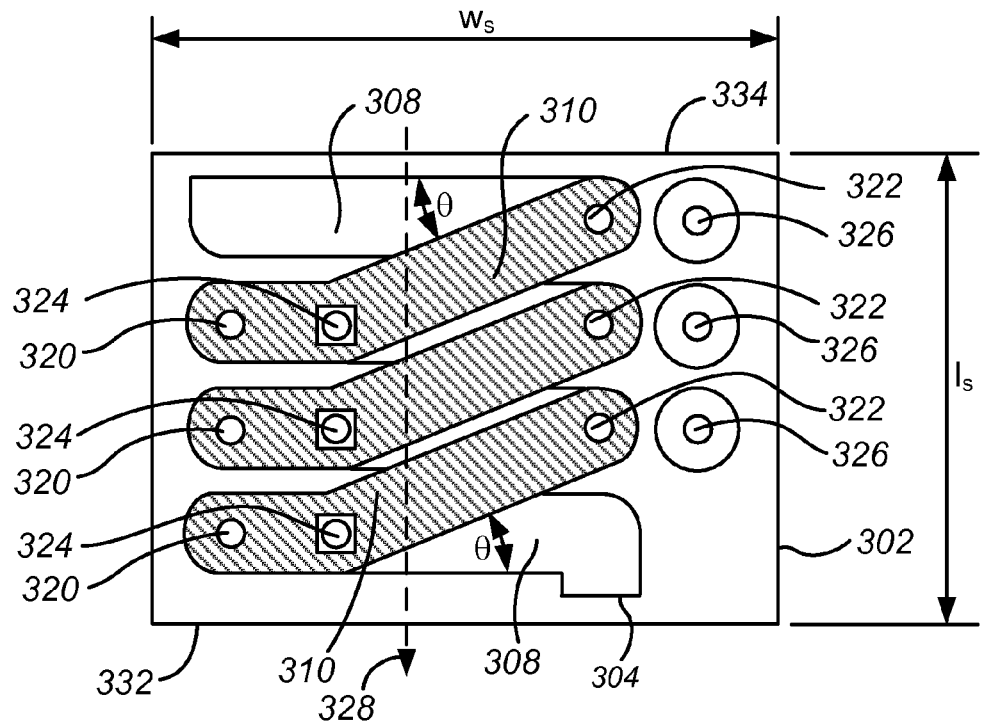
FIG. 4A shows a top view, including hidden lines, of a first inductor of the example solenoid transformer design of FIG. 3.
Figure 4B:
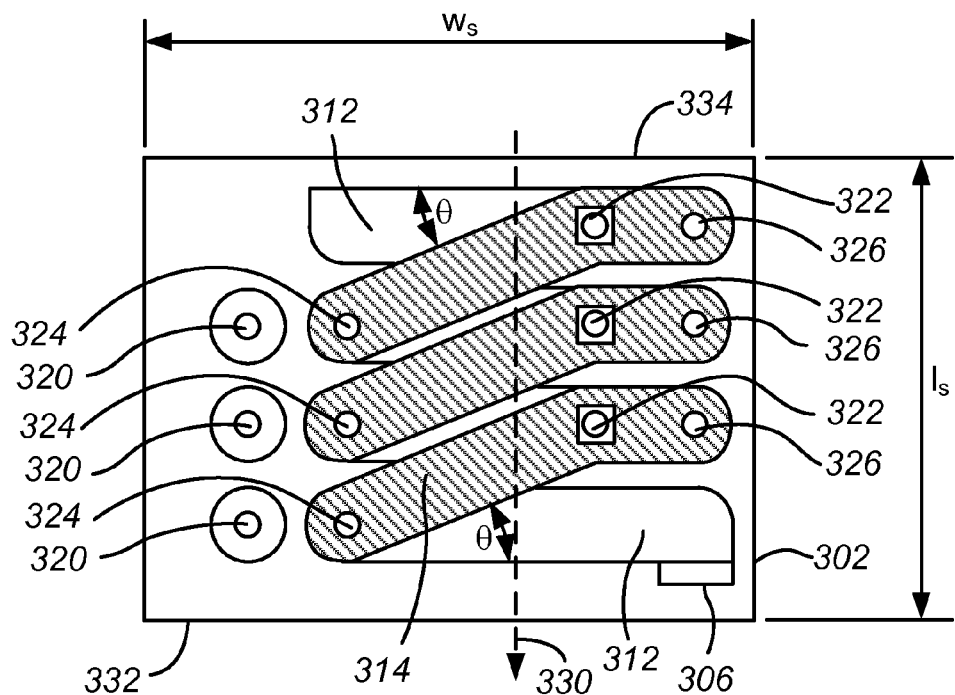
FIG. 4B shows a top view, including hidden lines, of a second inductor of the example solenoid transformer design of FIG. 3.

FIG. 3 shows an axonometric view, including hidden lines, of an example solenoid transformer design 300 in which the windings of the first inductor 304 are three-dimensionally interleaved with the windings of the second inductor 306. FIG. 4A shows a top view, including hidden lines, of a first inductor of the example solenoid transformer design of FIG. 3. FIG. 4B shows a top view, including hidden lines, of a second inductor of the example solenoid transformer design of FIG. 3. Arrows 301 indicate the H field lines; that is, the direction of the H field by and through the inductors 304 and 306. The substrate 302 has a first surface 316 and a second surface 318 opposite the first surface 316. The first inductor 304 includes a plurality of first conductive pathways that together form a first conductive path. The plurality of first conductive pathways includes a first set of vias 320 extending from at least the first surface 316 to at least the second surface 318 and a second set of vias 322 extending from at least the first surface 316 to at least the second surface 318. The plurality of first conductive pathways includes a first set of traces 308 arranged over the first surface 316 that connect the first set of vias 320 with the second set of vias 322. The plurality of first conductive pathways further includes a second set of traces 310 arranged over the second surface 318 that connect the first set of vias 320 with the second set of vias 322.

Similarly, the second inductor 306 includes a plurality of second conductive pathways that together form a second conductive path. The plurality of second conductive pathways includes a third set of vias 324 extending from at least the first surface 316 to at least the second surface 318 and a fourth set of vias 326 extending from at least the first surface 316 to at least the second surface 318. The plurality of second conductive pathways includes a third set of traces 312 arranged over the first surface 316 that connect the third set of vias 324 with the fourth set of vias 326. The plurality of second conductive pathways further includes a fourth set of traces 314 arranged over the second surface 318 that connect the third set of vias 324 with the fourth set of vias 326.

There is an angle θ between the first traces 308 and the second traces 310. In some implementations, the same angle or a different angle θ also can be between the third traces 312 and the fourth traces 314. The angle θ can be any suitable angle to achieve the desired inductance or other electrical characteristics. In some implementations, the angle θ can be as small as the pitch of the traces or process flows permits. The first, second, third, and fourth sets of vias 320, 322, 324, and 326, respectively, are positioned to enable the first set of traces 308 and the third set of traces 312 to be arranged in an overlying but electrically isolated fashion along the first surface 316 and to enable the second set of traces 310 and the fourth set of traces 314 to be arranged in an overlying but electrically isolated fashion along the second surface 318.

Figure 5:
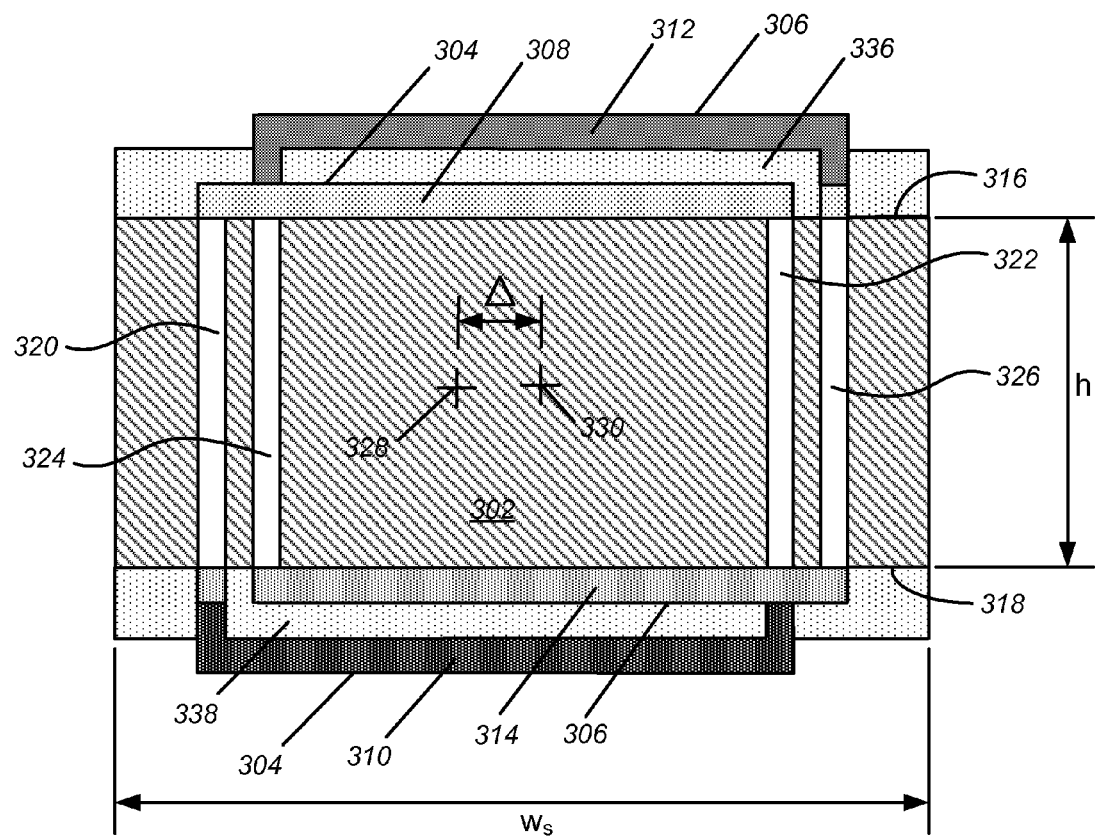
FIG. 5 shows a cross-sectional side view depiction of an example solenoid transformer design, such as the transformer design of FIG. 3, in which one or more dielectric layers insulate the first inductor from the second inductor.

FIG. 5 shows a cross-sectional side view depiction of an example solenoid transformer design, such as the transformer design 300 of FIG. 3, in which one or more dielectric layers insulate the first inductor 304 from the second inductor 306. More specifically, one or more dielectric layers 336 insulate portions of the first traces 308 from portions of the third traces 312 over the first surface 316. Similarly, one or more second dielectric layers 338 insulate portions of the second traces 310 from portions of the fourth traces 314 over the second surface 318, as FIG. 5 shows. The dielectric layers 336 enable the third traces 312 to overlay—but be insulated from—the first traces 308 over the first surface 316, while the dielectric layers 338 enable the second traces 310 to overly—but be insulated from—the fourth traces 314 over the second surface 318, as FIG. 5 shows. An advantageous result of such an implementation is that the pitch of the vias and traces can be doubled.

As shown in FIGS. 3-5, the first conductive pathways are three-dimensionally interleaved with the second conductive pathways. In some implementations, the first set of vias 320 is arranged in a first row and the second set of vias 322 is arranged in a second row. In some implementations, the first row of vias 320 is parallel to the second row of vias 322. In some implementations, the third set of vias 324 is arranged in a third row and the fourth set of vias 326 is arranged in a fourth row. In some implementations, the third row of vias 324 is approximately parallel to the fourth row of vias 326. In some implementations, the first row of vias 320 is approximately parallel to the third row of vias 324, and the second row of vias 322 is approximately parallel to the fourth row of vias 326.

In some implementations, the first conductive pathways can have a first axis of revolution 328 that passes through the first and second side surfaces 332 and 334. The second conductive pathways can have a second axis of revolution 330 that passes through the first and second side surfaces 332 and 334. In some implementations, the first axis of revolution 328 is laterally offset from the second axis of revolution 330. For example, the lateral offset Δ can be any suitable length to achieve the desired inductance or other electrical characteristics. In some implementations, the lateral offset can approximately match the pitch of the traces or the combined distance of the width of a trace and the width of the dielectric between the trace and the immediately neighboring trace. One or more of these distances also can be as small as process flows permit.

In some implementations, when the length of each first conductive pathway—the sum of the lengths of a first trace 308, a second trace 310, a first via 320, and a second via 322—is substantially equal to the length of each second conductive pathway—the sum of the lengths of a third trace 312, a fourth trace 314, a third via 324, and a fourth via 326—a ratio of the number of first conductive pathways to the number of second conductive pathways can characterize a transformation ratio of the transformer 300. That is, in some implementations, a ratio of the number of first conductive pathways—an effective number of turns of the first inductor—to the number of second conductive pathways—an effective number of turns of the second inductor—can characterize a transformation ratio of the transformer 300. The lateral offset Δ can enable a transformation ratio of 1:1 because the offset is also reflected in an offset in the first and third rows of vias and an offset in the second and fourth rows of vias. These offsets enable the length of each first conductive pathway to be equal to the length of each second conductive pathway.

In some other implementations, the first conductive pathways can have lengths different than the lengths of the second conductive pathways enabling a different transformation ratio. In some other implementations, the number of first conductive pathways can be different than the number of second conductive pathways enabling a different transformation ratio. For example, in some implementations, the number of first conductive pathways—an effective number of turns of the first inductor—can be in the range of one to ten or more. Similarly, the number of second conductive pathways—an effective number of turns of the second inductor—can be in the range of one to ten or more.

In such a three-dimensional implementation, because the first traces 308 and the third traces 312 are patterned in different respective layers of a multilayer structure over the first surface 316, and because the second traces 310 and the fourth traces 314 are patterned in different respective layers of a multilayer structure over the opposing second surface 318, each of the inductively-coupled first and second conductive paths of the first and second inductors 304 and 306, respectively, can occupy substantially the same footprint or area (save for the width between the first and third rows of vias 320 and 324 and the width between the second and fourth sets of vias 322 and 326). Because the windings of each of the first and second conductors 304 and 306 can occupy substantially the same footprint, the length of the device from surface 332 to 334 can be reduced by a factor of two. As a result, the total footprint required by the transformer 300 can potentially be reduced by approximately a factor of 2 as compared with, for example, the transformer 200 of FIG. 2.

Figure 6:
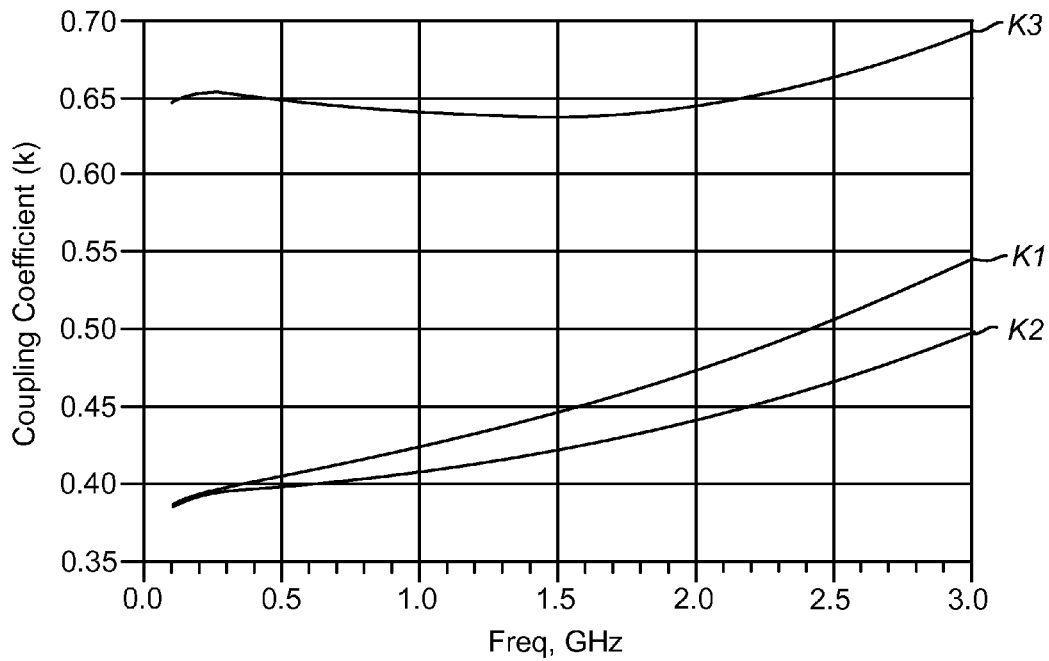
FIG. 6 shows plots of the coupling coefficient k as a function of an applied frequency in GHz obtained from simulations using the transformer designs shown in FIGS. 1, 2, and 3.
Figure 7:
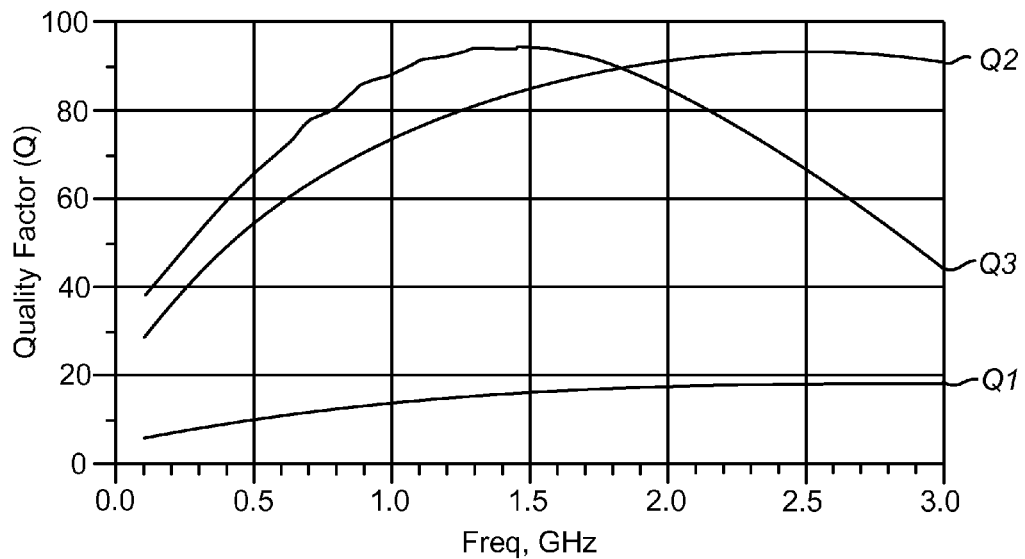
FIG. 7 shows plots of the Q factor as a function of an applied frequency in GHz obtained from simulations using the transformer designs shown in FIGS. 1, 2, and 3.

Furthermore, the coupling coefficient k of the transformer 300 can be increased over that of, for example, transformers 100 and 200 of FIGS. 1 and 2, respectively. FIG. 6 shows plots k1, k2, and k3 of the coupling coefficient k as a function of an applied frequency in GHz obtained from simulations using the transformer designs 100, 200, and 300, respectively, shown in FIGS. 1, 2, and 3, respectively. In some implementations, the transformer design 300 achieves a value of k in the range of approximately 0.6 to approximately 0.8. FIG. 7 shows plots Q1, Q2, and Q3 of the Q factor as a function of an applied frequency in GHz obtained from simulations using the transformer designs 100, 200, and 300, respectively, shown in FIGS. 1, 2, and 3, respectively. In some implementations, the transformer design 300 achieves a Q factor in the range of approximately 60 to approximately 100. In some implementations, the transformer design 300 can achieve these k and Q factor values in half the footprint surface area of a transformer design 100 that only achieves a k value in the range of approximately 0.4 to 0.5 and a Q factor in the range of approximately 5 to approximately 20. In some implementations, the transformer design 300 can achieve these k and Q factor values with half the footprint surface area of a transformer design 200 that only achieves a k value in the range of approximately 0.4 to 0.5 and a Q factor in the range of approximately 60 to approximately 100.

Figure 8:
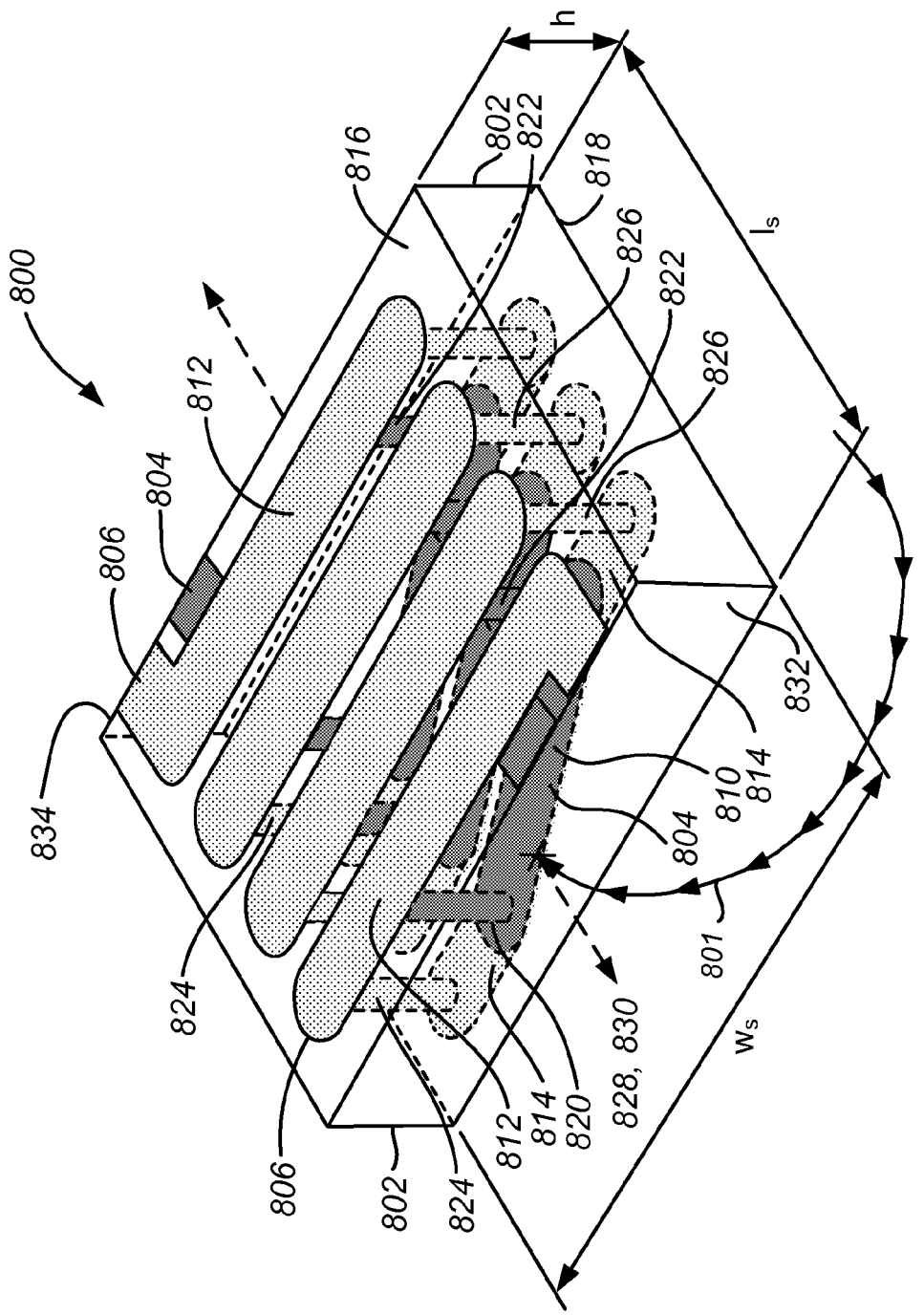
FIG. 8 shows an axonometric view, including hidden lines, of an example solenoid transformer design in which the windings of the first inductor are three-dimensionally interleaved with and arranged within the windings of the second inductor.

FIG. 8 shows an axonometric view, including hidden lines, of an example solenoid transformer 800 design in which the windings of the first inductor 804 are three-dimensionally interleaved with and arranged within the windings of the second inductor 806. In particular, the entire first conductive path of the first inductor 804 is arranged within a region around which is arranged the second conductive path of the second conductor 806. Arrows 801 indicate the H field lines; that is, the direction of the H field by and through the inductors 804 and 806.

The substrate 802 has a first surface 816 and a second surface 818 opposite the first surface 816. The first inductor 804 includes a plurality of first conductive pathways that together form a first conductive path. The plurality of first conductive pathways includes a first set of vias 820 extending from at least the first surface 816 to at least the second surface 818 and a second set of vias 822 extending from at least the first surface 816 to at least the second surface 818. The plurality of first conductive pathways includes a first set of traces 808 arranged over the first surface 816 that connect the first set of vias 820 with the second set of vias 822. The plurality of first conductive pathways further includes a second set of traces 810 arranged over the second surface 818 that connect the first set of vias 820 with the second set of vias 822.

Similarly, the second inductor 806 includes a plurality of second conductive pathways that together form a second conductive path. The plurality of second conductive pathways includes a third set of vias 824 extending from at least the first surface 816 to at least the second surface 818 and a fourth set of vias 826 extending from at least the first surface 816 to at least the second surface 818. The plurality of second conductive pathways includes a third set of traces 812 arranged over the first surface 816 that connect the third set of vias 824 with the fourth set of vias 826. The plurality of second conductive pathways further includes a fourth set of traces 814 arranged over the second surface 818 that connect the third set of vias 824 with the fourth set of vias 826.

Figure 9A:
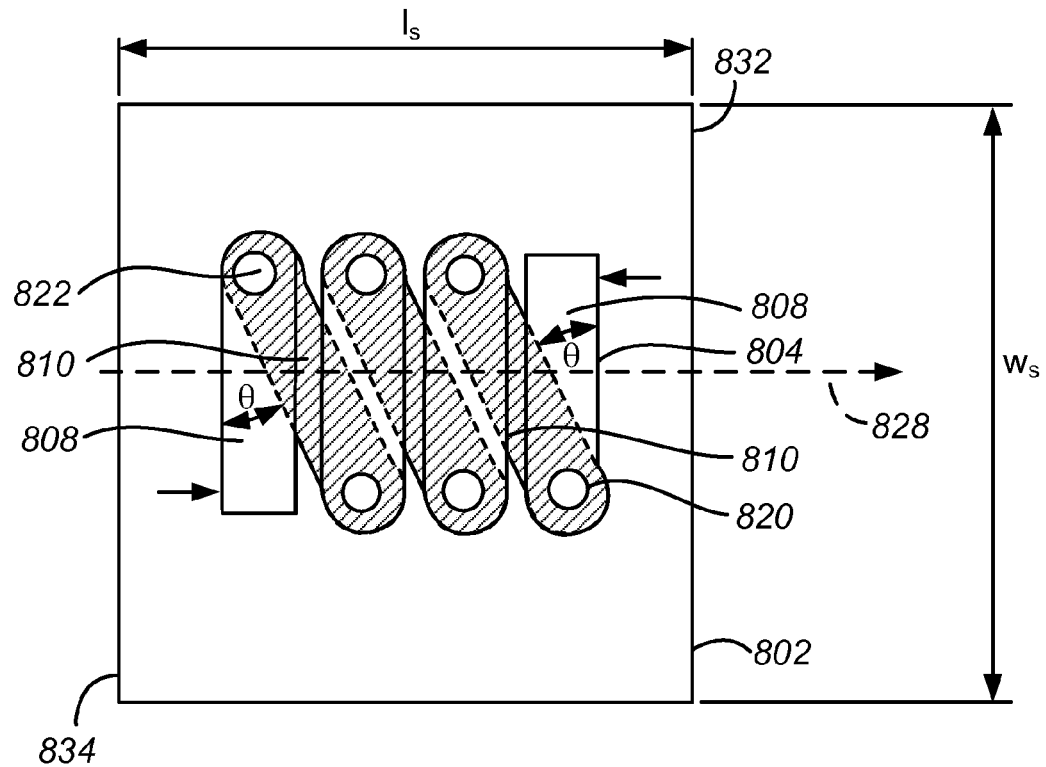
FIG. 9A shows a top view, including hidden lines, of a first inductor of the example solenoid transformer design of FIG. 8.
Figure 9B:
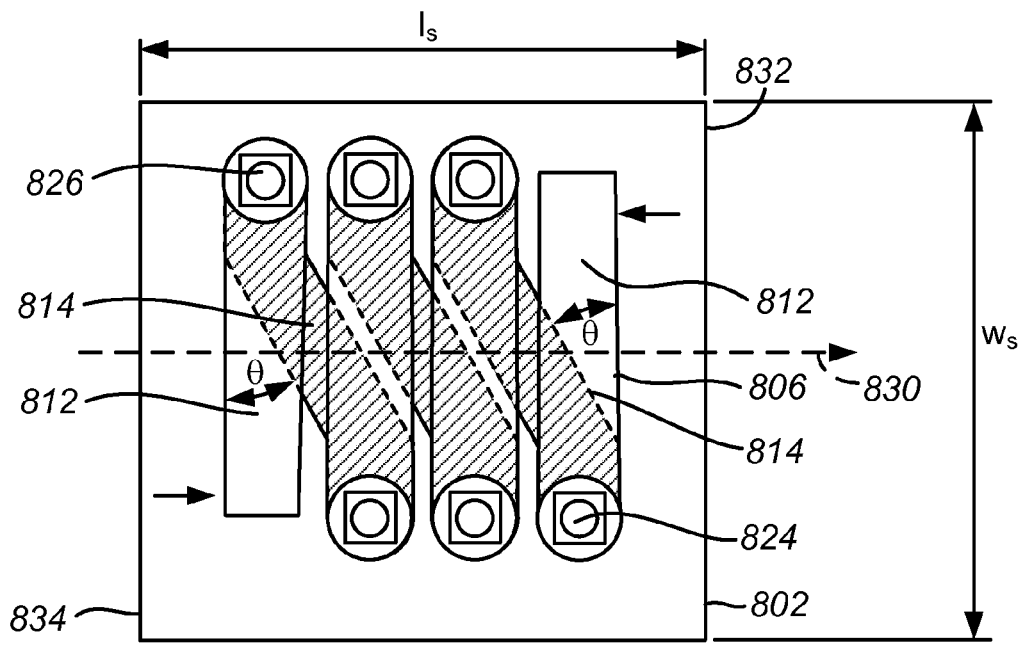
FIG. 9B shows a top view, including hidden lines, of a second inductor of the example solenoid transformer design of FIG. 8.

There is an angle θ between the first traces 808 and the second traces 810. In some implementations, the same angle or a different angle θ also can be between the third traces 812 and the fourth traces 814. The angle θ can be any suitable angle to achieve the desired inductance or other electrical characteristics. In some implementations, the angle θ can be as small as the pitch of the traces or process flows permits. The first, second, third, and fourth sets of vias 820, 822, 824, and 826, respectively, are positioned to enable the first set of traces 808 and the third set of traces 812 to be arranged in an overlying fashion along the first surface 816 and to enable the second set of traces 810 and the fourth set of traces 834 to be arranged in an overlying fashion along the second surface 818. FIG. 9A shows a top view, including hidden lines, of the first inductor 804 of the example solenoid transformer design 800 of FIG. 10. FIG. 9B shows a top view, including hidden lines, of the second inductor 806 of the example solenoid transformer design 800 of FIG. 8.

Figure 10:
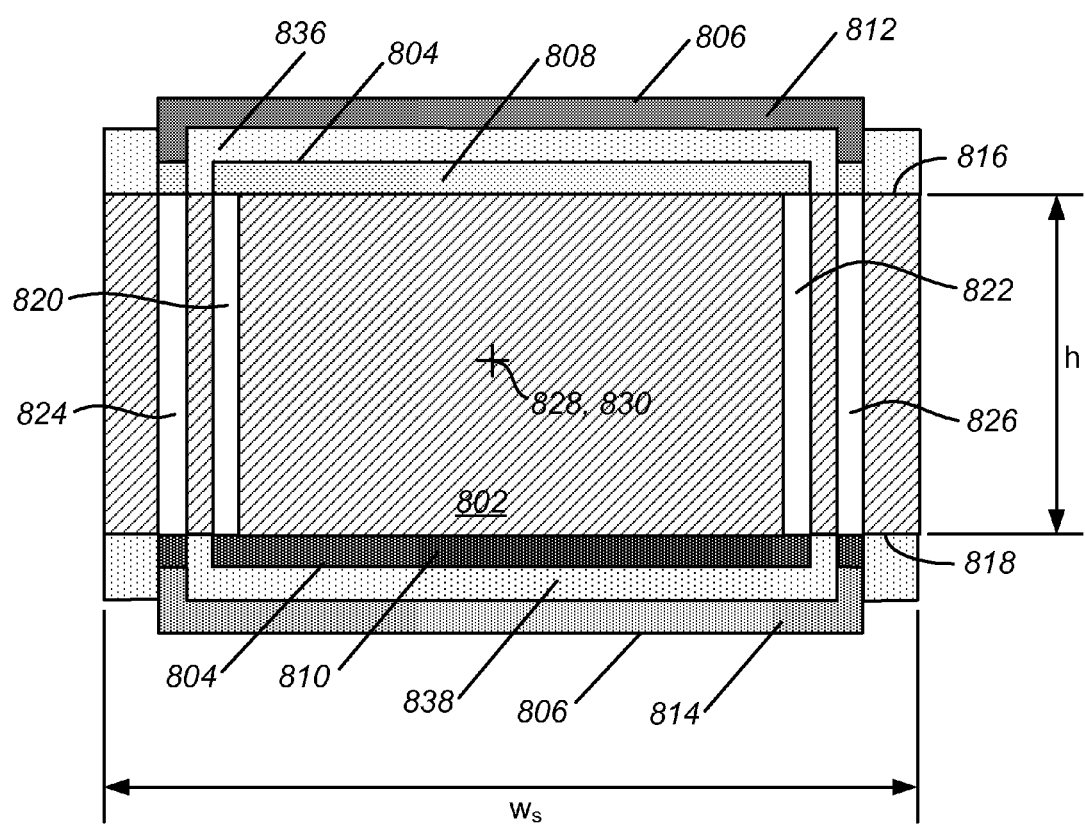
FIG. 10 shows a cross-sectional side view depiction of an example solenoid transformer design, such as the transformer design of FIG. 8, in which one or more dielectric layers insulate the first inductor from the second inductor.

FIG. 10 shows a cross-sectional side view depiction of an example solenoid transformer design, such as the transformer design 800 of FIG. 8, in which one or more dielectric layers insulate the first inductor from the second inductor. More specifically, one or more dielectric layers 836 insulate portions of the first traces 808 from portions of the third traces 812 over the first surface 816. Similarly, one or more second dielectric layers 838 insulate portions of the second traces 810 from portions of the fourth traces 814 over the second surface 818. The dielectric layers 836 enable the third traces 812 to overly—but be insulated from—the first traces 808 over the first surface 816, while the dielectric layers 838 enable the fourth traces 814 to overly—but be insulated from—the second traces 810 over the second surface 818.

In some implementations, the first conductive pathways can have a first axis of revolution 828 that passes through the first and second side surfaces 832 and 834. The second conductive pathways can have a second axis of revolution 830 that passes through the first and second side surfaces 832 and 834. In some implementations, the first axis of revolution 828 is collinear with the second axis of revolution 830. In some other implementations, the first axis of revolution 828 can be laterally offset from the second axis of revolution 830.

Figure 11A:
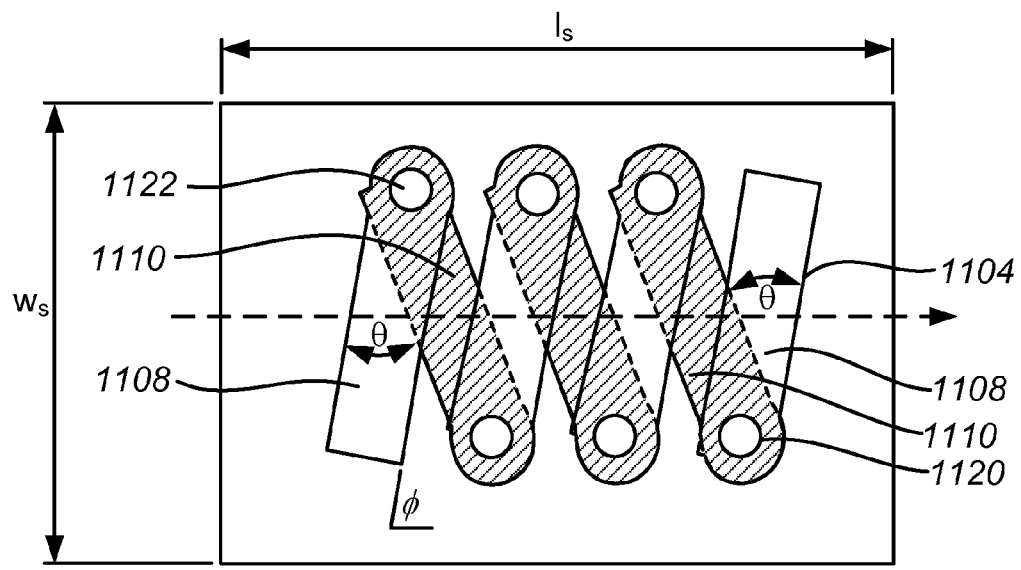
FIG. 11A shows a top view, including hidden lines, of a first inductor of another example solenoid transformer design in which the first inductor is three-dimensionally interleaved with and arranged within the second inductor.
Figure 11B:
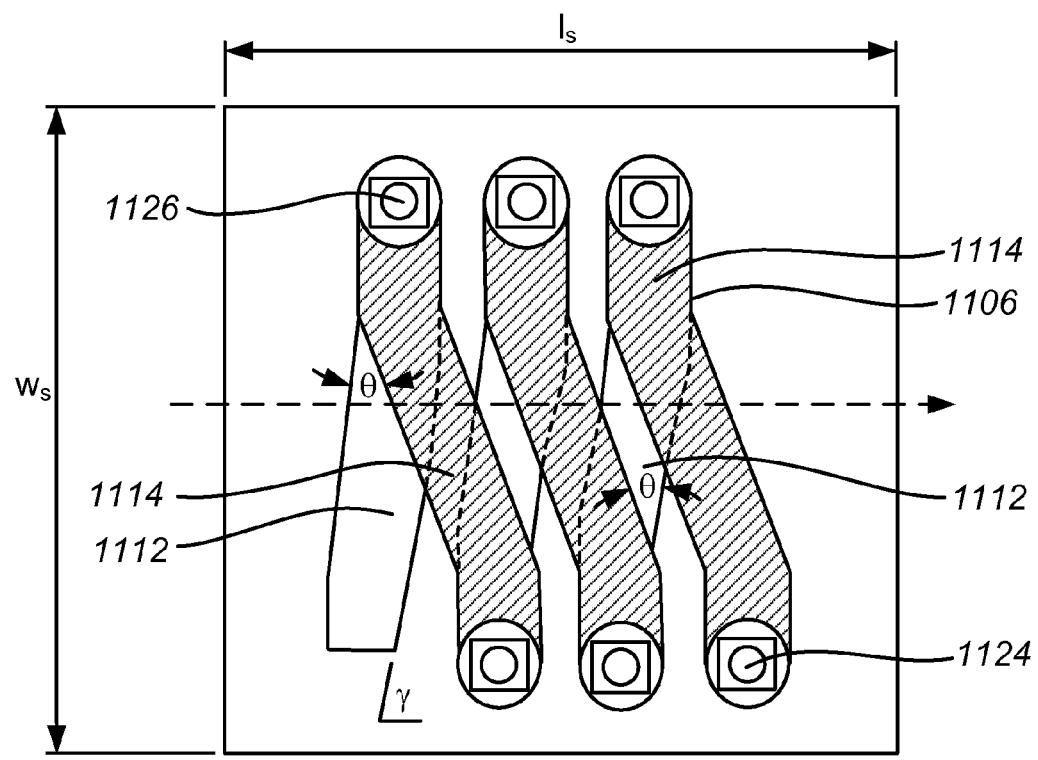
FIG. 11B shows a top view, including hidden lines, of the second inductor of the example solenoid transformer design of FIG. 11A.

FIG. 11A shows a top view, including hidden lines, of a first inductor 1104 of another example solenoid transformer design in which the first inductor 1104 is three-dimensionally interleaved with and arranged within the second inductor 1106. FIG. 11B shows a top view, including hidden lines, of the second inductor 1106 of the example solenoid transformer design of FIG. 11A. In FIGS. 11A and 11B, the first, second, third, and fourth traces 1108, 1110, 1112, and 1114, respectively, and the respective connecting vias 1120, 1122, 1124 and 1126 can be arranged to enable a smaller angle θ between the first traces 1108 and the second traces 1110 (the same angle θ or a different angle θ also can be between the third traces 1112 and the fourth traces 1114 in some implementations) which can result in more overlap of all the traces. For example, the first and second traces 1108 and 1110 can be rotated (as compared to first and second traces 808 and 810) by an angle φ while third traces and fourth traces 1112 and 1114 can be rotated (as compared to third and fourth traces 812 and 814) by an angle γ (Similar modifications, although not illustrated, can be made to the design of FIG. 3, for example, to enable more overlap).

Figure 12:
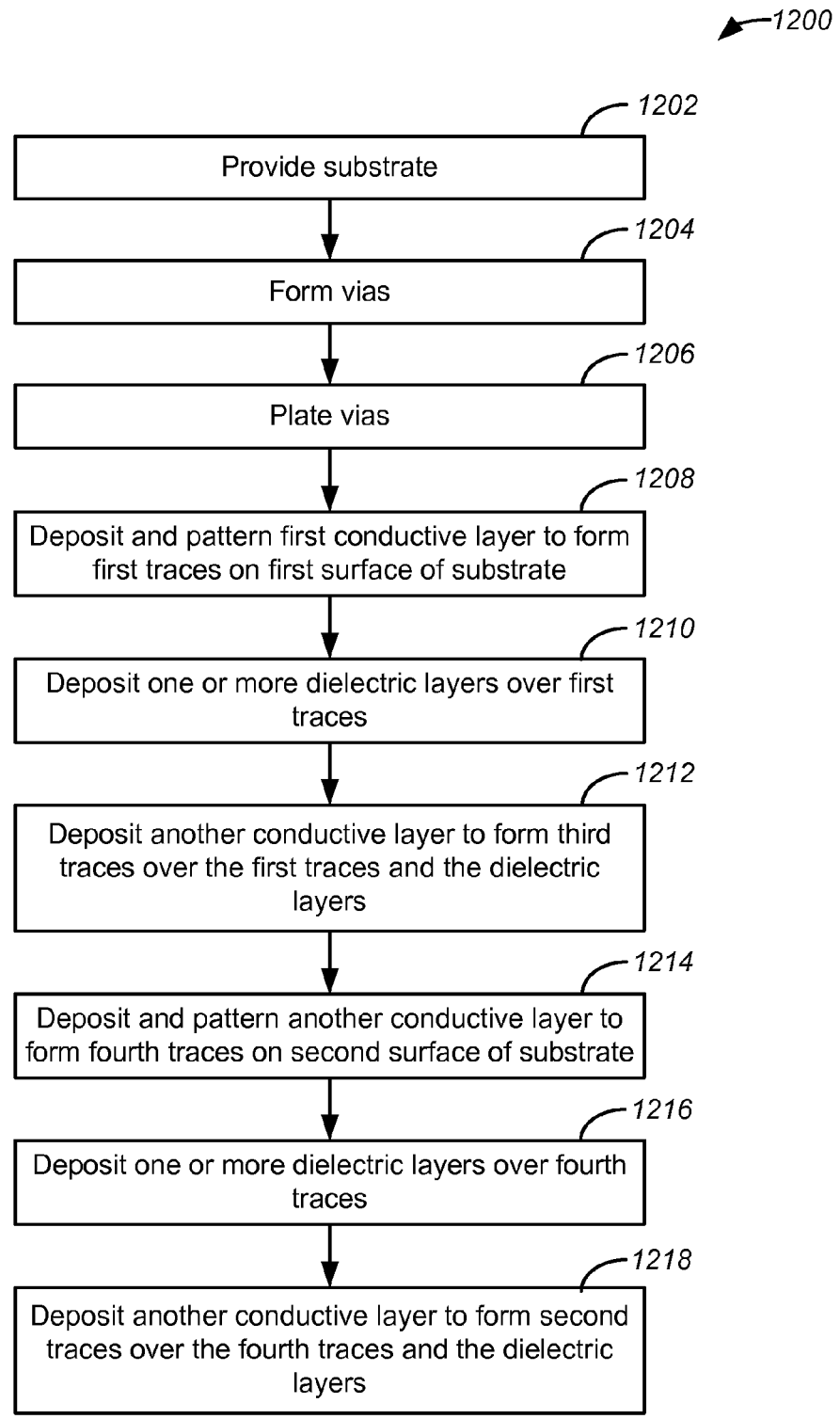
FIG. 12 is a flow diagram depicting an example process for forming a transformer such as the transformer of FIG. 3.

FIG. 12 is a flow diagram depicting an example process 1200 for forming a transformer such as the transformer design 300 of FIG. 3. In some implementations, process 1200 begins in block 1202 with providing a substrate, such as substrate 302. In some implementations, first, second, third, and fourth rows of vias are formed in block 1204 through the substrate, such as vias 320, 322, 324, and 326. The vias can be plated or filled in block 1206 with a conductive layer to enable electrical conduction through the vias. In some implementations, a first conductive layer is then deposited or patterned in block 1208 on a first surface of the substrate so as to form first traces, such as first traces 308. For example, the traces can be formed by physical vapor deposition (PVD) including thermal evaporation one or more metals or metallic alloys or sputtering one or more targets of one or more metals or metallic alloys followed by one or more lithographic techniques including, for example, photoresist patterning, etching, and photoresist, cleaning. The traces also can be formed by seed layer deposition followed by, for example, photoresist patterning, electro- or electroless-plating, photoresist cleaning, and seed layer removal.

In some implementations, process 1200 proceeds in block 1210 with depositing one or more dielectric layers over and around the first traces, such as dielectric layers 336. For example, the dielectric layers can be formed by one or more chemical vapor deposition (CVD) processes including, for example, low-pressure CVD (LPCVD) and plasma-enhanced CVD (PECVD). The deposited dielectric material (e.g., mostly oxide) can then be patterned to provide insulation where indicated and to allow for electrical connection to vias where indicated. In some implementations, process 1200 proceeds in block 1212 with depositing or patterning another conductive layer to form additional traces over the first traces, such as third traces 312. For example, the traces can be formed by any of the processes described above for forming the traces. In some implementations, additional dielectric or other layers also can be deposited over the additional traces (such as over the third traces 312).

In some implementations, another conductive layer is then deposited or patterned in block 1214 on a second surface of the substrate opposite the first surface so as to form additional traces on the second surface, such as fourth traces 314. For example, the traces can be formed by any of the processes described above for forming the traces.

In some implementations, process 1200 proceeds in block 1216 with depositing one or more dielectric layers over and around these traces, such as dielectric layers 338. For example, the dielectric layers can be formed by any of the processes described above for forming dielectric layers. In some implementations, process 1200 proceeds in block 1218 with depositing or patterning another conductive layer to form additional traces over the traces previously patterned over the second surface, such as second traces 310. For example, the traces can be formed by any of the processes described above for forming traces. In some implementations, additional dielectric or other layers also can be deposited over the additional traces (such as over the second traces 310).

Figure 13:
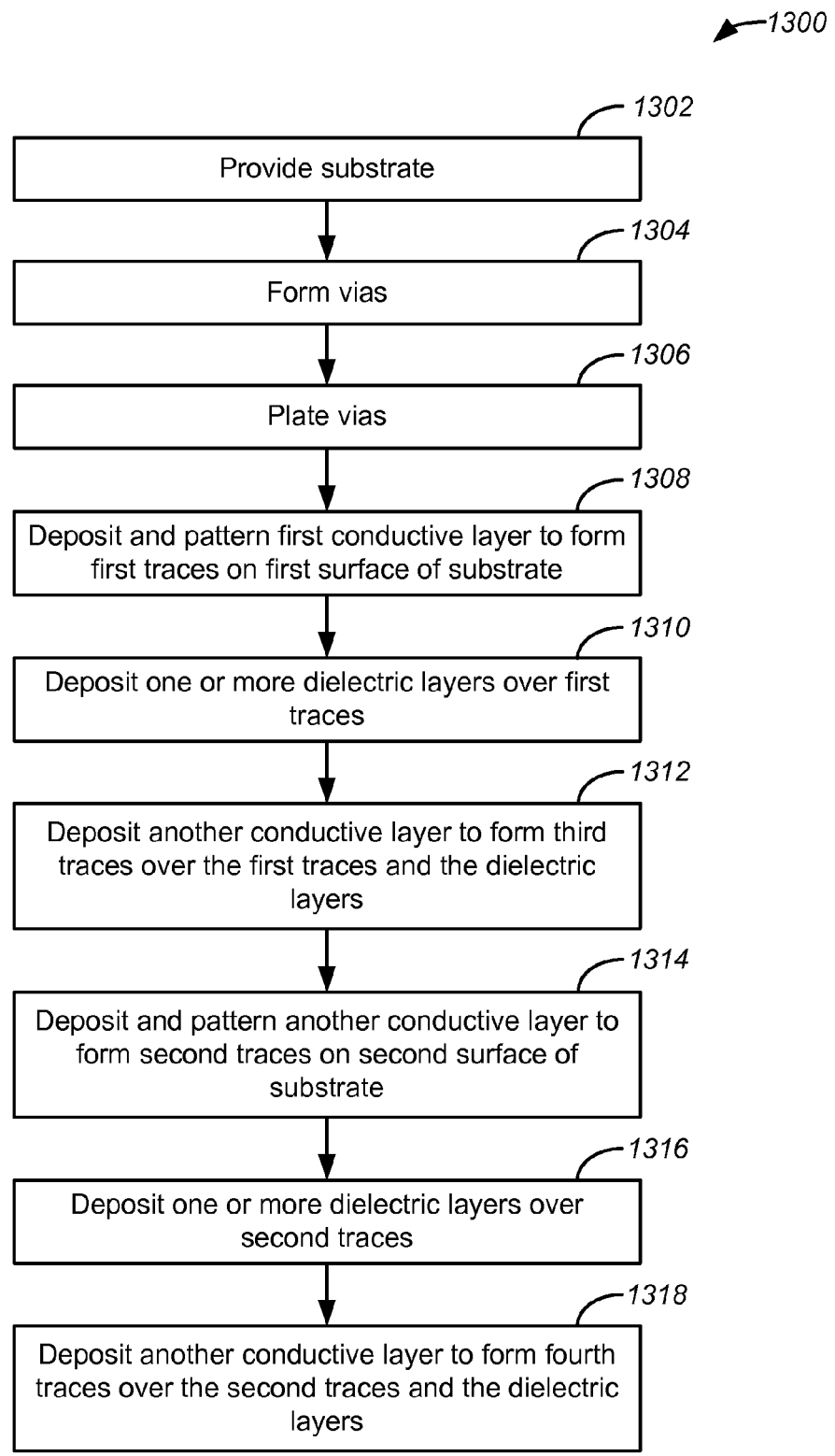
FIG. 13 is a flow diagram depicting an example process for forming a transformer such as the transformer of FIG. 8.

FIG. 13 is a flow diagram depicting an example process 1300 for forming a transformer such as the transformer design 800 of FIG. 10. In some implementations, process 1300 begins in block 1302 with providing a substrate, such as substrate 802. In some implementations, first, second, third, and fourth rows of vias are formed in block 1304 through the substrate, such as vias 820, 822, 824, and 826. The vias can be plated or filled in block 1306 with a conductive layer to enable electrical conduction through the vias. In some implementations, a first conductive layer is then deposited or patterned in block 1308 on a first surface of the substrate so as to form first traces, such as first traces 808. For example, the traces can be formed by any of the processes described above for forming traces.

In some implementations, process 1300 proceeds in block 1310 with depositing one or more dielectric layers over and around the first traces, such as dielectric layers 836. For example, the dielectric layers can be formed by any of the processes described above for forming dielectric layers. In some implementations, process 1300 proceeds in block 1312 with depositing or patterning another conductive layer to form additional traces over the first traces, such as third traces 812. For example, the traces can be formed by any of the processes described above for forming traces. In some implementations, additional dielectric or other layers also can be deposited over the additional traces (such as over the third traces 812).

In some implementations, a second conductive layer is then deposited or patterned in block 1314 on a second surface of the substrate opposite the first surface so as to form additional traces on the second surface, such as second traces 814. For example, the traces can be formed by any of the processes described above for forming traces.

In some implementations, process 1300 proceeds in block 1316 with depositing one or more dielectric layers over and around these traces, such as dielectric layers 838. For example, the dielectric layers can be formed by any of the processes described above for forming dielectric layers. In some implementations, process 1300 proceeds in block 1318 with depositing or patterning another conductive layer to form additional traces over the second traces previously patterned over the second surface, such as fourth traces 814. For example, the traces can be formed by any of the processes described above for forming traces. In some implementations, additional dielectric or other layers also can be deposited over the additional traces (such as over the fourth traces 814).

In some implementations, any of the substrates described above can be a high-resistivity semiconducting substrate. In some implementations, the substrate can have a length $l_s$ in the range of approximately 100 μm to approximately 5000

μm, a width $w_s$ in the range of approximately 100 μm to approximately 5000 μm, and a height or thickness h in the range of approximately 100 μm to approximately 800 μm.

In some implementations, the substrate can be made of display-grade glass (such as alkaline earth boro-aluminosilicate) or soda lime glass. Other suitable insulating materials include silicate glasses, such as alkaline earth aluminosilicate, borosilicate, or modified borosilicate. Also, ceramic materials such as aluminum oxide ($A10x$), yttrium oxide ($Y_2O_3$), boron nitride (BN), silicon carbide (SiC), aluminum nitride (A1N), and gallium nitride (GaNx) also can be used in some implementations. In some other implementations, high-resistivity Si can be used. In some implementations, silicon on insulator (SOI) substrates, gallium arsenide (GaAs) substrates, indium phosphide (InP) substrates, and plastic (polyethylene naphthalate or polyethylene terephthalate) substrates, e.g., associated with flexible electronics, also can be used.

In some implementations, any of the vias described above can be produced by etching through the respective substrate. In some other implementations, the vias can be produced by micro-machining, drilling, or by other suitable means. In some implementations, one or more conductive layers are then plated or otherwise deposited on the surfaces of the vias such that the vias can conduct electric current from the respective ones of the traces on or over the first surface of the substrate to the respective ones of the traces on or over the second surface of the substrate. For example, in some implementations, the vias are plated with a conductive metal or metallic alloy. For example, the vias can be plated with nickel (Ni), aluminum (Al), copper (Cu), titanium (Ti), aluminum nitride (AlN), titanium nitride (TiN), aluminum copper (AlCu), molybdenum (Mo), aluminum silicon (AlSi), platinum (Pt), tungsten (W), ruthenium (Ru), or other appropriate or suitable materials or combinations thereof. In some implementations, the vias can have widths or diameters in the range of approximately 20 μm to approximately 200 μm, while the conductive layers within the vias can have a thickness in the range of approximately 1 μm to approximately 30 μm or even fill the volume of the via entirely.

In some implementations, any of the traces described above can be produced by masking and sputtering or otherwise patterning and depositing one or more conductive layers. For example, in some implementations, the traces can be plated with or otherwise formed from nickel (Ni), aluminum (Al), copper (Cu), titanium (Ti), aluminum nitride (AlN), titanium nitride (TiN), aluminum copper (AlCu), molybdenum (Mo), aluminum silicon (AlSi), platinum (Pt), tungsten (W), ruthenium (Ru), or other appropriate or suitable materials or combinations thereof. In some implementations, the traces can have a length in the range of approximately 100 μm to approximately 2000 μm, a width in the range of approximately 20 μm to approximately 300 μm, and a thickness in the range of approximately 1 μm to approximately 30 μm.

In some implementations, any of the dielectric layers described above can be produced by masking, patterning, etching, or through other lithographic techniques. For example, in some implementations, the dielectric layers can be formed from silicon oxide ($SiO_x$) silicon nitride ($SiN_x$), or silicon oxy-nitride (SiON). In some other implementations, the dielectric layers can be formed of polyimide or benzocyclobutene (BCB) or similar materials, which can be desirable as they don't require photoresists because they are already photo-patternable. In some implementations, the dielectric layers can have a thickness that is greater than or equal to the thickness of the adjacent traces.

The description herein is directed to certain implementations for the purposes of describing the innovative aspects of this disclosure. However, a person having ordinary skill in the art will readily recognize that the teachings herein can be applied in a multitude of different ways. The described implementations may be implemented in any device or system that can be configured to display an image, whether in motion (e.g., video) or stationary (e.g., still image), and whether textual, graphical or pictorial. More particularly, it is contemplated that the described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, GPS receivers/navigators, cameras, MP3 players, camcorders, game consoles, wrist watches, clocks, calculators, television monitors, flat panel displays, electronic reading devices (i.e., e-readers), computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS), microelectromechanical systems (MEMS) and non-MEMS applications), aesthetic structures (e.g., display of images on a piece of jewelry) and a variety of EMS devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

An example of a suitable EMS or MEMS device, to which the described implementations may apply, is a reflective display device. Reflective display devices can incorporate interferometric modulators (IMODs) to selectively absorb and/or reflect light incident thereon using principles of optical interference. IMODs can include an absorber, a reflector that is movable with respect to the absorber, and an optical resonant cavity defined between the absorber and the reflector. The reflector can be moved to two or more different positions, which can change the size of the optical resonant cavity and thereby affect the reflectance of the IMOD. The reflectance spectrums of IMODs can create fairly broad spectral bands which can be shifted across the visible wavelengths to generate different colors. The position of the spectral band can be adjusted by changing the thickness of the optical resonant cavity, i.e., by changing the position of the reflector.

Figure 14A:
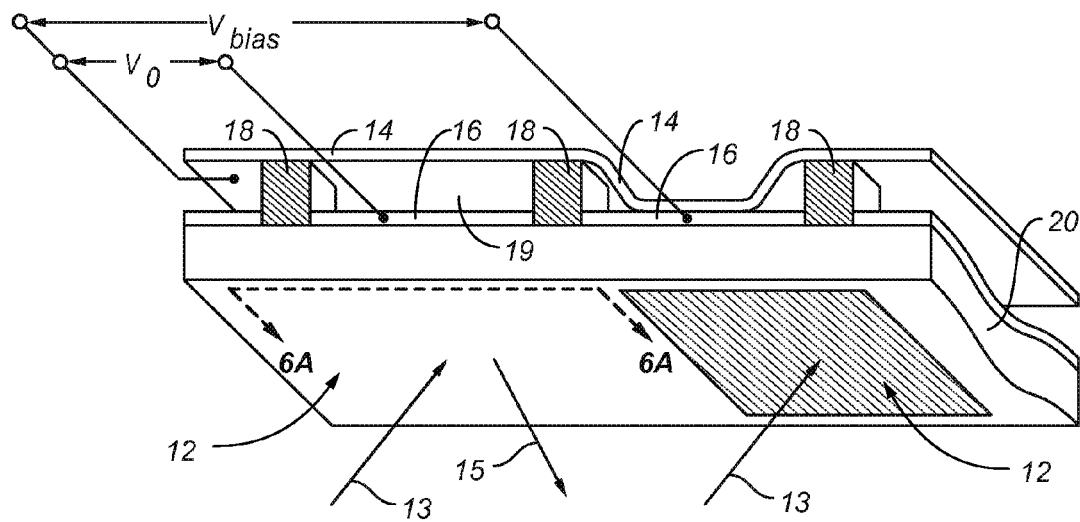
FIG. 14A shows an isometric view depicting two adjacent example pixels in a series of pixels of an example IMOD display device.

FIG. 14A shows an example of an isometric view depicting two adjacent pixels in a series of pixels of an IMOD display device. The IMOD display device includes one or more interferometric MEMS display elements. In these devices, the pixels of the MEMS display elements can be in either a bright or dark state. In the bright ("relaxed," "open" or "on") state, the display element reflects a large portion of incident visible light, e.g., to a user. Conversely, in the dark ("actuated," "closed" or "off") state, the display element reflects little incident visible light. In some implementations, the light reflectance properties of the on and off states may be reversed. MEMS pixels can be configured to reflect predominantly at particular wavelengths allowing for a color display in addition to black and white.

The IMOD display device can include a row/column array of IMODs. Each IMOD can include a pair of reflective layers, i.e., a movable reflective layer and a fixed partially reflective layer, positioned at a variable and controllable distance from each other to form an air gap (also referred to as an optical gap or cavity). The movable reflective layer may be moved between at least two positions. In a first position, i.e., a relaxed position, the movable reflective layer can be positioned at a relatively large distance from the fixed partially reflective layer. In a second position, i.e., an actuated position, the movable reflective layer can be positioned more closely to the partially reflective layer. Incident light that reflects from the two layers can interfere constructively or destructively depending on the position of the movable reflective layer, producing either an overall reflective or non-reflective state for each pixel. In some implementations, the IMOD may be in a reflective state when unactuated, reflecting light within the visible spectrum, and may be in a dark state when unactuated, reflecting light outside of the visible range (such as infrared light). In some other implementations, however, an IMOD may be in a dark state when unactuated, and in a reflective state when actuated. In some implementations, the introduction of an applied voltage can drive the pixels to change states. In some other implementations, an applied charge can drive the pixels to change states.

The depicted portion of the pixel array in FIG. 14A includes two adjacent IMODs 12. In the IMOD 12 on the left (as illustrated), a movable reflective layer 14 is illustrated in a relaxed position at a predetermined distance from an optical stack 16, which includes a partially reflective layer. The voltage V0 applied across the IMOD 12 on the left is insufficient to cause actuation of the movable reflective layer 14. In the IMOD 12 on the right, the movable reflective layer 14 is illustrated in an actuated position near or adjacent the optical stack 16. The voltage Vbias applied across the IMOD 12 on the right is sufficient to maintain the movable reflective layer 14 in the actuated position.

In FIG. 14A, the reflective properties of pixels 12 are generally illustrated with arrows 13 indicating light incident upon the pixels 12, and light 15 reflecting from the IMOD 12 on the left. Although not illustrated in detail, it will be understood by one having ordinary skill in the art that most of the light 13 incident upon the pixels 12 will be transmitted through the transparent substrate 20, toward the optical stack 16. A portion of the light incident upon the optical stack 16 will be transmitted through the partially reflective layer of the optical stack 16, and a portion will be reflected back through the transparent substrate 20. The portion of light 13 that is transmitted through the optical stack 16 will be reflected at the movable reflective layer 14, back toward (and through) the transparent substrate 20. Interference (constructive or destructive) between the light reflected from the partially reflective layer of the optical stack 16 and the light reflected from the movable reflective layer 14 will determine the wavelength(s) of light 15 reflected from the IMOD 12.

The optical stack 16 can include a single layer or several layers. The layer(s) can include one or more of an electrode layer, a partially reflective and partially transmissive layer and a transparent dielectric layer. In some implementations, the optical stack 16 is electrically conductive, partially transparent and partially reflective, and may be fabricated, for example, by depositing one or more of the above layers onto a transparent substrate 20. The electrode layer can be formed from a variety of materials, such as various metals, for example indium tin oxide (ITO). The partially reflective layer can be formed from a variety of materials that are partially reflective, such as various metals, e.g., chromium (Cr), semiconductors, and dielectrics. The partially reflective layer can be formed of one or more layers of materials, and each of the layers can be formed of a single material or a combination of materials. In some implementations, the optical stack 16 can include a single semi-transparent thickness of metal or semiconductor which serves as both an optical absorber and conductor, while different, more conductive layers or portions (e.g., of the optical stack 16 or of other structures of the IMOD) can serve to bus signals between IMOD pixels. The optical stack 16 also can include one or more insulating or dielectric layers covering one or more conductive layers or a conductive/absorptive layer.

In some implementations, the layer(s) of the optical stack 16 can be patterned into parallel strips, and may form row electrodes in a display device as described further below. As will be understood by one having skill in the art, the term "patterned" is used herein to refer to masking as well as etching processes. In some implementations, a highly conductive and reflective material, such as aluminum (Al), may be used for the movable reflective layer 14, and these strips may form column electrodes in a display device. The movable reflective layer 14 may be formed as a series of parallel strips of a deposited metal layer or layers (orthogonal to the row electrodes of the optical stack 16) to form columns deposited on top of posts 18 and an intervening sacrificial material deposited between the posts 18. When the sacrificial material is etched away, a defined gap 19, or optical cavity, can be formed between the movable reflective layer 14 and the optical stack 16. In some implementations, the separation between posts 18 may be approximately 1-800 um, while the gap 19 may be less than 10,000 Angstroms (Å).

In some implementations, each pixel of the IMOD, whether in the actuated or relaxed state, is essentially a capacitor formed by the fixed and moving reflective layers. When no voltage is applied, the movable reflective layer 14 remains in a mechanically relaxed state, as illustrated by the IMOD 12 on the left in FIG. 14A, with the gap 19 between the movable reflective layer 14 and optical stack 16. However, when a potential difference, e.g., voltage, is applied to at least one of a selected row and column, the capacitor formed at the intersection of the row and column electrodes at the corresponding pixel becomes charged, and electrostatic forces pull the electrodes together. If the applied voltage exceeds a threshold, the movable reflective layer 14 can deform and move near or against the optical stack 16. A dielectric layer (not shown) within the optical stack 16 may prevent shorting and control the separation distance between the layers 14 and 16, as illustrated by the actuated IMOD 12 on the right in FIG. 14A. The behavior is the same regardless of the polarity of the applied potential difference. Though a series of pixels in an array may be referred to in some instances as "rows" or "columns," a person having ordinary skill in the art will readily understand that referring to one direction as a "row" and another as a "column" is arbitrary. Restated, in some orientations, the rows can be considered columns, and the columns considered to be rows. Furthermore, the display elements may be evenly arranged in orthogonal rows and columns (an "array"), or arranged in non-linear configurations, for example, having certain positional offsets with respect to one another (a "mosaic"). The terms "array" and "mosaic" may refer to either configuration. Thus, although the display is referred to as including an "array" or "mosaic," the elements themselves need not be arranged orthogonally to one another, or disposed in an even distribution, in any instance, but may include arrangements having asymmetric shapes and unevenly distributed elements.

Figure 14B:
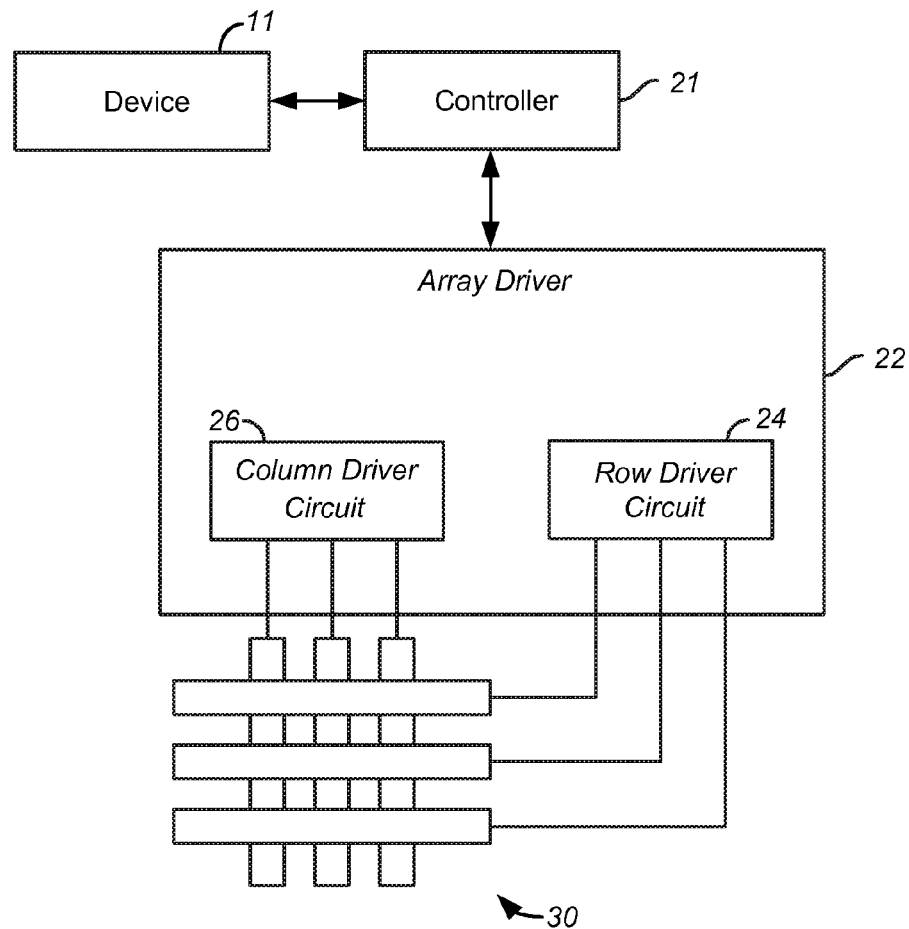
FIG. 14B shows an example system block diagram depicting an example electronic device incorporating an IMOD display.

FIG. 14B shows an example of a system block diagram depicting an electronic device incorporating a 3×3 IMOD display. The electronic device depicted in FIG. 14B represents one implementation in which a piezoelectric resonator transformer constructed in accordance with the implementations described above with respect to FIGS. 1-13 can be incorporated. The electronic device in which device 11 is incorporated may, for example, form part or all of any of the variety of electrical devices and electromechanical systems devices set forth above, including both display and non-display applications.

Here, the electronic device includes a controller 21, which may include one or more general purpose single- or multi-chip microprocessors such as an ARMO, Pentium®, 8051, MIPS®, Power PC®, or ALPHA®, or special purpose microprocessors such as a digital signal processor, microcontroller, or a programmable gate array. Controller 21 may be configured to execute one or more software modules. In addition to executing an operating system, the controller 21 may be configured to execute one or more software applications, including a web browser, a telephone application, an email program, or any other software application.

The controller 21 is configured to communicate with device 11. The controller 21 also can be configured to communicate with an array driver 22. The array driver 22 can include a row driver circuit 24 and a column driver circuit 26 that provide signals to, e.g., a display array or panel 30. Although FIG. 14B shows a 3×3 array of IMODs for the sake of clarity, the display array 30 may contain a very large number of IMODs, and may have a different number of IMODs in rows than in columns, and vice versa. Controller 21 and array driver 22 may sometimes be referred to herein as being "logic devices" and/or part of a "logic system."

Figure 15A:
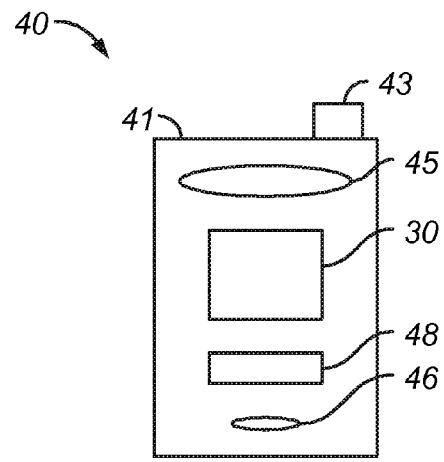
FIGS. 15A and 15B show examples of system block diagrams depicting an example display device that includes a plurality of IMODs.
Figure 15B:
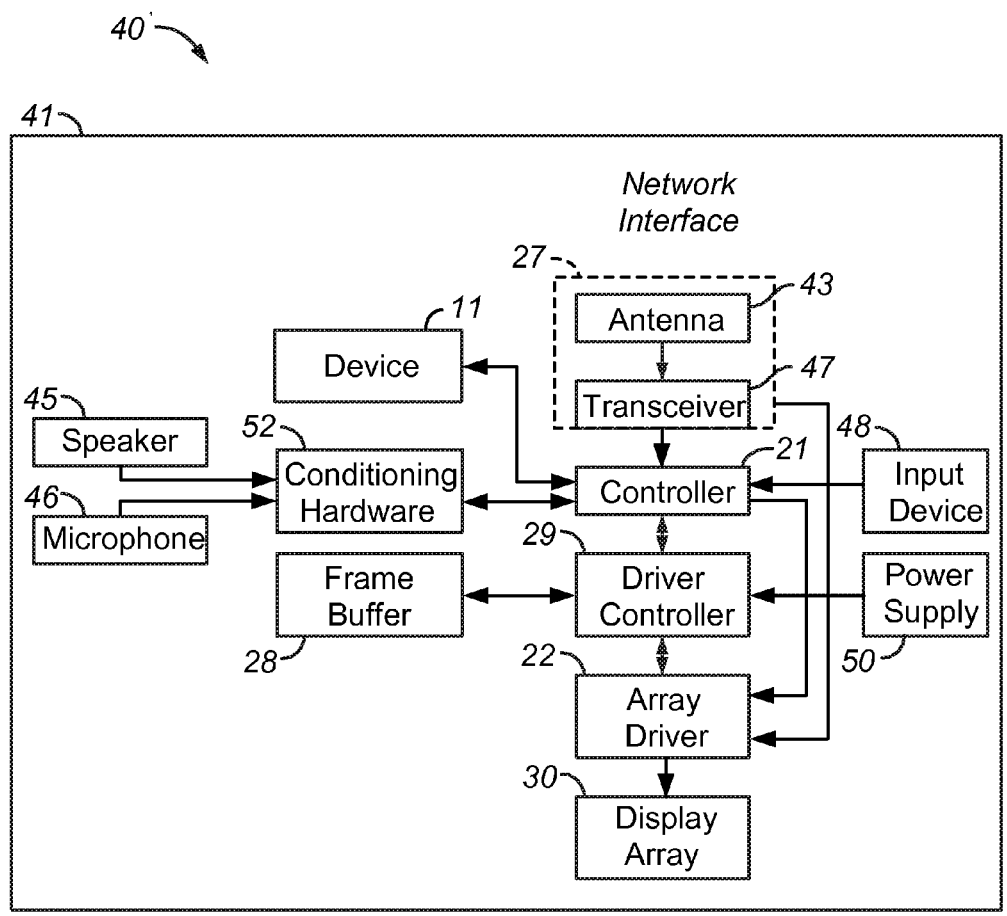

FIGS. 15A and 15B show examples of system block diagrams depicting a display device 40 that includes a plurality of IMODs. The display device 40 can be, for example, a smart phone, a cellular or mobile telephone. However, the same components of the display device 40 or slight variations thereof are also illustrative of various types of display devices such as televisions, tablets, e-readers, hand-held devices and portable media players.

The display device 40 includes a housing 41, a display 30, an antenna 43, a speaker 45, an input device 48 and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display, as described herein. The display 30 also can be configured to include a flat-panel display, such as plasma, EL, OLED, STN LCD, or TFT LCD, or a non-flat-panel display, such as a CRT or other tube device. In addition, the display 30 can include an IMOD display, as described herein.

The components of the display device 40 are schematically illustrated in FIG. 15B. The display device 40 includes a housing 41 and can include additional components at least partially enclosed therein. For example, the display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. In some implementations, a power supply 50 can provide power to substantially all components in the particular display device 40 design.

The network interface 27 includes the antenna 43 and the transceiver 47 so that the display device 40 can communicate with one or more devices over a network. The network interface 27 also may have some processing capabilities to relieve, for example, data processing requirements of the processor 21. The antenna 43 can transmit and receive signals. In some implementations, the antenna 43 transmits and receives RF signals according to the IEEE 16.11 standard, including IEEE 16.11(a), (b), or (g), or the IEEE 802.11 standard, including IEEE 802.11a, b, g, n, and further implementations thereof. In some other implementations, the antenna 43 transmits and receives RF signals according to the BLUETOOTH standard. In the case of a cellular telephone, the antenna 43 is designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1xEV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G or 4G technology. The transceiver 47 can pre-process the signals received from the antenna 43 so that they may be received by and further manipulated by the processor 21. The transceiver 47 also can process signals received from the processor 21 so that they may be transmitted from the display device 40 via the antenna 43.

In some implementations, the transceiver 47 can be replaced by a receiver. In addition, in some implementations, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that is readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation and gray-scale level.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of pixels.

In some implementations, the driver controller 29, the array driver 22, and the display array 30 are appropriate for any of the types of displays described herein. For example, the driver controller 29 can be a conventional display controller or a bi-stable display controller (such as an IMOD controller). Additionally, the array driver 22 can be a conventional driver or a bi-stable display driver (such as an IMOD display driver). Moreover, the display array 30 can be a conventional display array or a bi-stable display array (such as a display including an array of IMODs). In some implementations, the driver controller 29 can be integrated with the array driver 22. Such an implementation can be useful in highly integrated systems, for example, mobile phones, portable-electronic devices, watches or small-area displays.

In some implementations, the input device 48 can be configured to allow, for example, a user to control the operation of the display device 40. The input device 48 can include a keypad, such as a QWERTY keyboard or a telephone keypad, a button, a switch, a rocker, a touch-sensitive screen, a touch-sensitive screen integrated with the display array 30, or a pressure- or heat-sensitive membrane. The microphone 46 can be configured as an input device for the display device 40. In some implementations, voice commands through the microphone 46 can be used for controlling operations of the display device 40.

The power supply 50 can include a variety of energy storage devices. For example, the power supply 50 can be a rechargeable battery, such as a nickel-cadmium battery or a lithium-ion battery. In implementations using a rechargeable battery, the rechargeable battery may be chargeable using power coming from, for example, a wall socket or a photovoltaic device or array. Alternatively, the rechargeable battery can be wirelessly chargeable. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

The various illustrative logics, logical blocks, modules, circuits and algorithm steps described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and steps described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, e.g., a combination of a DSP and a microprocessor, a plurality of microprocessors, one or more microprocessors in conjunction with a DSP core, or any other such configuration. In some implementations, particular steps and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of the IMOD as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A device comprising:
a substrate having a first surface and a second surface opposite the first surface;
a first inducting arrangement including a plurality of first conductive pathways that together form a first conductive path, the first conductive path having a first axis of revolution, the plurality of first conductive pathways including a first set of vias extending at least from the first surface to the second surface through the substrate, a second set of vias extending at least from the first surface to the second surface through the substrate, a first set of traces arranged over the first surface that connect the first set of vias with the second set of vias, and a second set of traces arranged over the second surface that connect the first set of vias with the second set of vias;
a second inducting arrangement inductively-coupled with and interleaved with the first inducting arrangement and including a plurality of second conductive pathways that together form a second conductive path, the second conductive path having a second axis of revolution, the first axis of revolution being laterally offset from and parallel to the second axis of revolution, at least part of the first axis of revolution being inside the second inducting arrangement, the second axis of revolution being inside the first inducting arrangement, the plurality of second conductive pathways including a third set of vias extending at least from the first surface to the second surface through the substrate, a fourth set of vias extending at least from the first surface to the second surface through the substrate, a third set of traces arranged over the first surface that connect the third set of vias with the fourth set of vias, and a fourth set of traces arranged over the second surface that connect the third set of vias with the fourth set of vias;
a first set of one or more dielectric layers that insulate portions of the first set of traces from portions of the third set of traces; and
a second set of one or more dielectric layers that insulate portions of the second set of traces from portions of the fourth set of traces;

wherein:
the first set of traces are formed from a first conductive layer deposited and patterned on the first surface;
the one or more dielectric layers that insulate portions of the first traces from portions of the third traces include a first dielectric layer deposited and patterned over the first surface so as to cover portions of the first set of traces;
the third set of traces are formed from a third conductive layer deposited and patterned over the first dielectric layer;
the fourth set of traces are formed from a fourth conductive layer deposited and patterned on the second surface;
the one or more dielectric layers that insulate portions of the second traces from portions of the fourth traces include a second dielectric layer deposited and patterned over the second surface so as to cover portions of the fourth set of traces; and
the second set of traces are formed from a second conductive layer deposited and patterned over the second dielectric layer.

2. The device of claim 1, wherein:
the first set of vias are arranged along a first row and the second set of vias are arranged along a second row, each of the first set of traces connecting a via from the first row with a via from the second row over the first surface, each of the second set of traces connecting a via from the first row with a via from the second row over the second surface; and
the third set of vias are arranged along a third row and the fourth set of vias are arranged along a fourth row, each of the third set of traces connecting a via from the third row with a via from the fourth row over the first surface, each of the fourth set of traces connecting a via from the third row with a via from the fourth row over the second surface.

3. The device of claim 2, wherein:
the first row is substantially parallel with the second row; and
the third row is substantially parallel with the fourth row.

4. The device of claim 3, wherein:
the first row is substantially parallel with the third row; and
the second row is substantially parallel with the fourth row.

5. The device of claim 1, wherein an effective number of turns of the first conductive pathways and an effective number of turns of the second conductive pathways are substantially equal as a result of the lateral offset such that the first inducting arrangement is inductively-coupled with the second inducting arrangement with a transformation ratio of substantially 1:1.

6. The device of claim 1, wherein the substrate is formed from glass, sapphire, or quartz.

7. The device of claim 1, wherein;
magnetic field lines within the substrate within the region of the substrate within both the first and the second inducting arrangements are parallel with the first and the second surfaces.

8. A device comprising:
a substrate having a first surface and a second surface opposite the first surface;
a first inducting means including a plurality of first conductive pathways that together form a first conductive path, the first conductive path having a first axis of revolution, the plurality of first conductive pathways including a first set of via means extending at least from the first surface to the second surface through the substrate, a second set of via means extending at least from the first surface to the second surface through the substrate, a first set of conductive means arranged over the first surface that connect the first set of via means with the second set of via means, and a second set of conductive means arranged over the second surface that connect the first set of via means with the second set of via means;

a second inducting means inductively-coupled with and interleaved with the first inducting means and including a plurality of second conductive pathways that together form a second conductive path, the second conductive path having a second axis of revolution, the first axis of revolution being laterally offset from the second axis of revolution, at least part of the first axis of revolution being inside the second inducting means, the second axis of revolution being inside the first inducting means, the plurality of second conductive pathways including a third set of via means extending at least from the first surface to the second surface through the substrate, a fourth set of via means extending at least from the first surface to the second surface through the substrate, a third set of conductive means arranged over the first surface that connect the third set of via means with the fourth set of via means, and a fourth set of conductive means arranged over the second surface that connect the third set of via means with the fourth set of via means;

a first set of one or more dielectric means that insulate portions of the first conductive means from portions of the third conductive means; and a second set of one or more dielectric means that insulate portions of the second conductive means from portions of the fourth conductive means.

9. The device of claim 8, wherein an effective number of turns of the first conductive pathways and an effective number of turns of the second conductive pathways are substantially equal as a result of the lateral offset such that the first inducting means is inductively-coupled with the second inducting means with a transformation ratio of substantially 1:1.

\* \* \* \* \*